United States Patent
Park et al.

(10) Patent No.: US 8,614,925 B2
(45) Date of Patent: Dec. 24, 2013

(54) SEMICONDUCTOR MEMORY DEVICE HAVING A REDUNDANCY AREA

(75) Inventors: Joonmin Park, Seoul (KR); Beakhyung Cho, Hwaseong-si (KR); Kwangjin Lee, Hwaseong-si (KR); Hye-Jin Kim, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 85 days.

(21) Appl. No.: 12/814,776

(22) Filed: Jun. 14, 2010

(65) Prior Publication Data

US 2010/0329053 A1 Dec. 30, 2010

(30) Foreign Application Priority Data

Jun. 29, 2009 (KR) ........................ 10-2009-0058427

(51) Int. Cl.
*G11C 7/00* (2006.01)

(52) U.S. Cl.
USPC .......................................................... 365/200

(58) Field of Classification Search
USPC .......................................... 365/200, 189.04
See application file for complete search history.

(56) References Cited

U.S. PATENT DOCUMENTS

| | | | | |
|---|---|---|---|---|
| 6,490,208 B2 * | 12/2002 | Yoon | ............................. | 365/200 |
| 7,149,139 B1 * | 12/2006 | Rosen | ........................... | 365/221 |
| 2002/0021614 A1 | 2/2002 | Kim et al. | | |
| 2006/0092724 A1 * | 5/2006 | Kanda | ........................... | 365/200 |
| 2006/0126407 A1 * | 6/2006 | Poechmueller | ............... | 365/200 |
| 2008/0259692 A1 * | 10/2008 | Hong | ...................... | 365/189.04 |

FOREIGN PATENT DOCUMENTS

| | | |
|---|---|---|
| KR | 10-0273256 B1 | 1/2001 |
| KR | 2001-0047533 A | 6/2001 |
| KR | 2002-0013277 A | 2/2002 |

* cited by examiner

*Primary Examiner* — Anthan Tran
(74) *Attorney, Agent, or Firm* — Harness, Dickey & Pierce, P.L.C.

(57) ABSTRACT

Provided is a semiconductor memory device. The semiconductor memory includes a main area and a redundancy area. The main area includes a plurality of memory blocks sharing a write bit line and a read bit line. The redundancy area includes a plurality of redundancy memory blocks sharing a redundancy write bit line and a redundancy read bit line. The redundancy area is provided to replace a component in the main area having a defect.

20 Claims, 18 Drawing Sheets

SEMICONDUCTOR MEMORY DEVICE HAVING A REDUNDANCY AREA

CROSS-REFERENCE TO RELATED APPLICATIONS

This U.S. non-provisional patent application claims priority under 35 U.S.C. §119 to Korean Patent Application No. 10-2009-0058427, filed on Jun. 29, 2009, in the Korean Intellectual Property Office (KIPO), the entire contents of which are hereby incorporated by reference.

BACKGROUND

1. Field

The example embodiments relate to a semiconductor memory device, and more particularly, to a semiconductor memory device having a repair means.

2. Description of the Related Art

Semiconductor memory devices are used to store data. The semiconductor memory devices are roughly divided into volatile memory devices and nonvolatile memory devices. Data stored in volatile memory devices is deleted when power supply is removed. On the other hand, data stored in nonvolatile memory devices is not deleted even when power supply is removed.

Because nonvolatile memory devices store data with low power, the nonvolatile memory devices are widely used as storage media for mobile devices. There is a variable resistance memory device as one of the nonvolatile memory devices. Hereinafter, the variable resistance memory device will be described as one example, but the scope of example embodiments of the inventive concepts will not be limited thereto. For example, other memory devices (e.g., FRAMs, MRAMs, DRAMs, and flash memories) may be applied.

Examples of the variable resistance memory devices include ferroelectric RAMs (FRAMs) using ferroelectric capacitors, magnetic RAMs (MRAMs) using Tunneling Magneto-Resistive (TMR) films, and phase change memory devices using chalcogenide alloys. Particularly, the phase change memory devices can be manufactured through a relatively simple process, and can implement a large-capacity memory at a low cost.

A typical variable resistance memory device includes a plurality of memory banks, each of which includes a write circuit and a detect circuit. As each of memory banks includes a write circuit and a detect circuit, the integration degree of the variable resistance memory device is reduced, and the complexity of the variable resistance memory device is increased.

SUMMARY

Example embodiments provide a semiconductor memory device having improved integration, a plurality of memory banks of which share a write circuit and a detect circuit.

Example embodiments provide a semiconductor memory device having improved processing speed by performing a read operation during a write operation on a plurality of memory banks.

Example embodiments provide a semiconductor memory device having improved reliability by repairing a defect generated in a semiconductor memory device.

Example embodiments of the inventive concepts provide semiconductor memory devices. The semiconductor memory devices include: a main area including a plurality of memory blocks sharing a write bit line and a read bit line. A redundancy area configured to replace one or more defective components of the memory blocks and including a plurality of redundancy memory blocks sharing a redundancy write bit line and a redundancy read bit line.

In example embodiments, the respective memory blocks may include a local bit line selector that selectively connects a local bit line in a corresponding memory block to the write bit line or the read bit line. The local bit line selector may connect the local bit line to the write bit line to perform a write operation on the corresponding memory block. The local bit line selector may connect the local bit line to the read bit line to perform a read operation on the corresponding memory block.

In example embodiments, the semiconductor memory device may perform a read operation on a different memory block during a write operation on one of the plurality of memory blocks. The semiconductor memory device may perform a read operation on another memory block when the read operation is completed on the different memory block during the write operation on the one of the plurality of memory blocks.

In example embodiments, during a write operation on one of the plurality of memory blocks, the semiconductor memory device may perform a read operation on a different memory block that shares the write bit line and the read bit line with the one of the plurality of memory blocks. During a write operation on one of the plurality of memory blocks, the semiconductor memory device may perform a read operation on a different memory block that does not share the write bit line and the read bit line with the one of the plurality of memory blocks.

In example embodiments, the memory blocks may include a redundancy local bit line selector that selectively connects a redundancy local bit line in a corresponding redundancy memory block to the redundancy write bit line or the redundancy read bit line. The redundancy local bit line selector may connect the redundancy local bit line to the redundancy write bit line to perform a write operation on the corresponding redundancy memory block. The redundancy local bit line selector may connect the redundancy local bit line to the redundancy read bit line to perform a read operation on the corresponding redundancy memory block. The semiconductor memory device may perform a read operation on one of the plurality of redundancy memory blocks during a write operation on one of the plurality of memory blocks. The semiconductor memory device may perform a read operation on another memory block when the read operation is completed on the one of the plurality of the redundancy memory blocks during the write operation on the one of the plurality of memory blocks. The semiconductor memory device may perform a read operation on another redundancy memory block when the read operation is completed on the one of the plurality of the redundancy memory blocks during the write operation on the one of the plurality of memory blocks.

In example embodiments, during a write operation on one of the plurality of memory blocks, the semiconductor memory device may perform a read operation on a different redundancy memory block that shares the redundancy write bit line and the redundancy read bit line with the one of the plurality of redundancy memory blocks. The semiconductor memory device may perform a read operation on another memory block when the read operation is completed on the different redundancy memory block that shares the redundancy write bit line and the redundancy read bit line with the one of the plurality of redundancy memory blocks. The semiconductor memory device may perform a read operation on another redundancy memory block when the read operation is completed on the one of the plurality of the redundancy memory blocks during the write operation on the one of the plurality of memory blocks.

In example embodiments, the redundancy area may include an address fuse, and activate a redundancy write bit line corresponding to the address fuse when an address stored in the address fuse is identical to a write address inputted from the outside. The redundancy area may include an address fuse, and activate a redundancy read bit line corresponding to the address fuse when an address stored in the address fuse is identical to a write address inputted from the outside.

In example embodiments of the inventive concepts, semiconductor memory devices include at least one first bit line, a first global bit line connected to the first bit line for a write operation, a second global bit line connected to the first bit line for a read operation, a second bit line for replacing the first bit line, a third global bit line connected to the second bit line for a write operation, and a fourth global bit line connected to the second bit line for a read operation.

In example embodiments, the second bit line may be connected to the third global bit line in response to a write request for the first bit line when there is a defect in the first bit line. The second bit line may be connected to the fourth global bit line in response to a read request for the first bit line when there is a defect in the first bit line.

In example embodiments of the inventive concepts, semiconductor memory devices include at least one first bit line, at least one second bit line disposed in a column direction with respect to the first bit line, a first global bit line selectively connected to the first and second bit lines for a write operation, a second global bit line selectively connected to the first and second bit lines for a read operation, a third bit line for replacing the first bit line, a fourth bit line disposed in a column direction with respect to the third bit line to replace the second bit line, a third global bit line selectively connected to the third bit line for a write operation, and a fourth global bit line selectively connected to the fourth bit line for a read operation.

In example embodiments, the first bit line may be connected to the first global bit line to perform the write operation on the first bit line, and the second bit line may be connected to the second global bit line to perform the read operation on the second bit line. The write operation on the first bit line and the read operation on the second bit line may be simultaneously performed.

In example embodiments of the inventive concepts, semiconductor memory devices include at least one first bit line, a first global bit line connected to the first bit line for a write operation, a second global bit line connected to the first bit line for a read operation, at least one second bit line, a third global bit line connected to the second bit line for a write operation, and a fourth global bit line connected to the second bit line for a read operation. The semiconductor memory devices may include a third bit line for replacing the first bit line, a fifth global bit line connected to the third bit line for a write operation, a sixth global bit line connected to the third bit line for a read operation, a fourth bit line for replacing the second bit line, a seventh global bit line connected to the fourth bit line for a write operation, and a eighth global bit line connected to the fourth bit line for a read operation.

In example embodiments, the first bit line may be connected to the first global bit line to perform the write operation on the first bit line, and the second bit line may be connected to the fourth global bit line to perform the read operation on the second bit line. The first bit line may be connected to the second global bit lined to perform the read operation on the first bit line, and the second bit line may be connected to the third global bit line to perform the write operation on the second bit line. The third bit line may be connected to the fifth global bit line when there is a defect in the first bit line and a write request for the first bit line from the outside. The third bit line may be connected to the sixth global bit line when there is a defect in the first bit line and a read request for the first bit line from the outside.

BRIEF DESCRIPTION OF THE DRAWINGS

The accompanying drawings are included to provide a further understanding of example embodiments of the inventive concepts, and are incorporated in and constitute a part of this specification. The drawings illustrate example embodiments of the inventive concepts and, together with the description, serve to explain principles of example embodiments of the inventive concepts. In the drawings.

Figure 1:
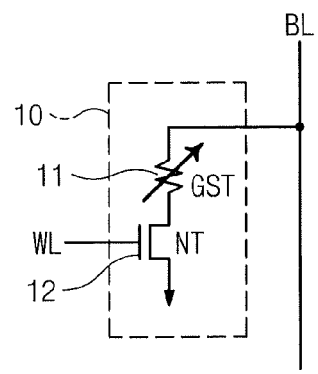
FIGS. 1 and 2 are diagrams illustrating a memory cell of a variable resistance memory device.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/ or structural elements may be reduced or exaggerated for clarity. The use of similar or identical reference numbers in the various drawings is intended to indicate the presence of a similar or identical element or feature.

DETAILED DESCRIPTION OF THE EMBODIMENTS

Example embodiments of the inventive concepts will be described below in more detail with reference to the accompanying drawings. The example embodiments of the inventive concepts may, however, be embodied in different forms and should not be construed as limited to the example embodiments set forth herein. Rather, these example embodiments are provided so that this disclosure will be thorough and complete, and will fully convey the scope of example embodiments of the inventive concepts to those skilled in the art.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Below, a variable resistance memory device is used as an example for illustrating characteristics and functions of example embodiments. However, those skilled in the art can easily understand other advantages and performances of example embodiments according to the descriptions. Example embodiments may be embodied or applied through other example embodiments. Besides, the detailed description may be amended or modified according to viewpoints and applications, not being out of the scope, technical idea and other objects of example embodiments.

Figure 2:
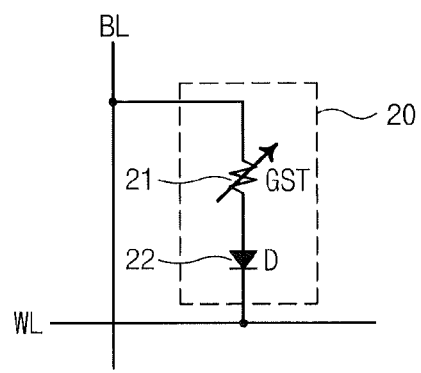

FIGS. 1 and 2 are diagrams illustrating a memory cell of a variable resistance memory device. Referring to FIG. 1, a memory cell 10 may include a memory element 11 and the select element 12. The memory element 11 may be electrically connected between a bit line BL and a select element 12, and the select element 12 may be electrically between the memory element 11 and a ground terminal.

The memory element 11 may include a variable resistance material GST. The variable resistance material GST may be an element such as Ge—Sb—Te having variable resistance according to temperature. For example, the variable resistance material GST may have one of a crystal state and an amorphous state. The variable resistance material GST may be changed into the crystal state or the amorphous state according to a current supplied through the bit line BL. The variable resistance memory device may program data using the above characteristics of the variable resistance material GST.

The select element 12 may include an NMOS transistor NT. The gate of the NMOS transistor NT may be electrically connected to a word line WL. If a certain voltage is applied to the word line WL, the NMOS transistor NT may be turned on. If the NMOS transistor NT is turned on, the memory element 11 may be supplied with a current through the bit line BL. Although it has been described in FIG. 1 that the memory element 11 is electrically connected between the bit line BL and the select element 12, the select element 12 may be electrically connected between the bit line BL and the memory element 11.

Referring to FIG. 2, a memory cell 20 may include a memory element 21 and a select element 22. The memory element 21 may be electrically connected between the bit line BL and the select element 22, and the select element 22 may be electrically connected between the memory device 21 and a ground terminal. The memory element 21 may include a variable resistance material GST and may be substantially identical to the memory element 11 of FIG. 1.

The select element 22 may include a diode D. The memory element 21 may be electrically connected to the anode of the diode D, and a word line WL may be electrically connected to the cathode of the diode D. If a voltage difference between the anode and the cathode of the diode D becomes greater than a threshold voltage of the diode D, the diode D may be turned on. If the diode D is turned on, the memory element 21 may be supplied with a current through the bit line BL.

Figure 3:
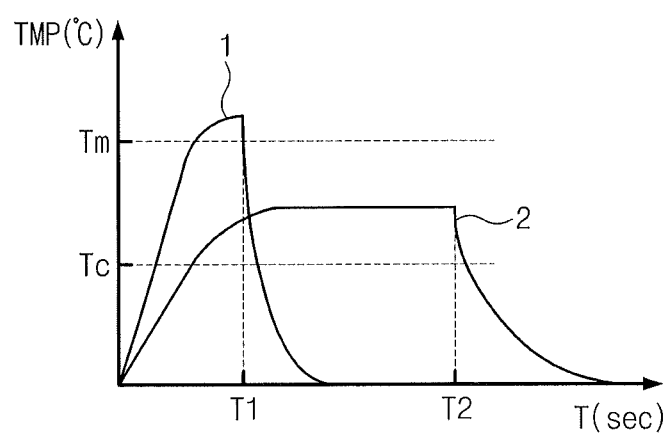
FIG. 3 is a graph illustrating the characteristics of a variable resistance material (GST) of FIGS. 1 and 2.

FIG. 3 is a graph illustrating the characteristics of a variable resistance material (GST) of FIGS. 1 and 2. In FIG. 3, reference numeral 1 shows a condition of a variable resistance material GST entering an amorphous state, and reference numeral 2 shows a condition of a variable resistance material GST entering a crystal state.

The variable resistance material GST may enter an amorphous state if the variable resistance material GST is rapidly quenched after being heated for a certain time T1 at a temperature higher than the melting temperature Tm. The amorphous state may be commonly called a reset state, and store data '1'. The variable resistance memory device may provide a reset current to the variable resistance material GST to program in the reset state.

The variable resistance material GST may enter a crystal state if the variable resistance material GST is gradually quenched after being heated for a certain time T2 longer than T1 at a temperature higher than the crystallization temperature Tc and lower than the melting temperature Tm. The crystal state may be commonly called a set state, and store data '0'. The variable resistance memory device may provide a set current to the variable resistance material GST to program in the set state.

Figure 4:
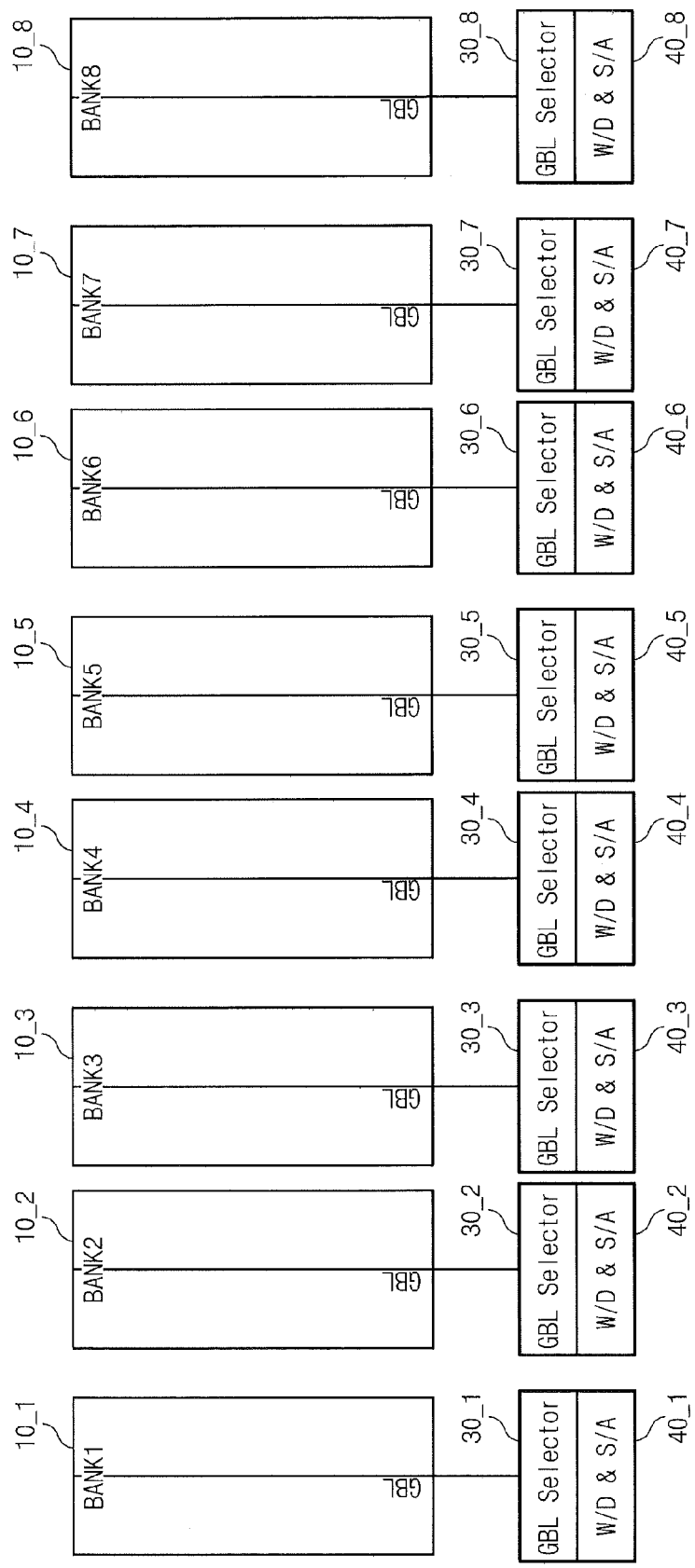
FIGS. 4 and 5 are diagrams illustrating a typical nonvolatile memory device.
Figure 5:
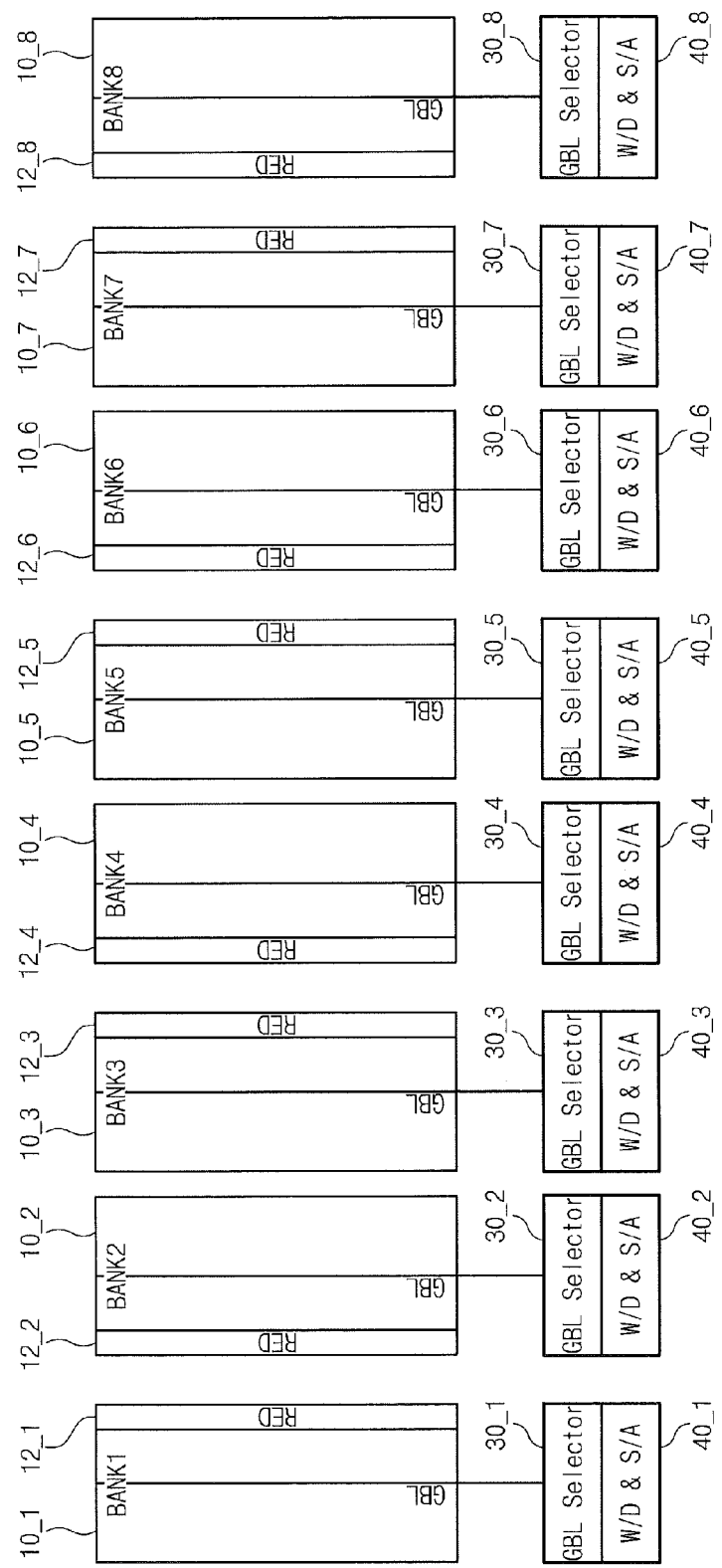

FIGS. 4 and 5 are diagrams illustrating a typical nonvolatile memory device. Only eight memory banks are shown in FIGS. 4 and 5 for convenience of explanation, but the scope of example embodiments of the inventive concepts will not be limited thereto. Referring to FIG. 4, a nonvolatile memory device may include a plurality of memory banks 10_1 to 10_8, a plurality of global bit line selectors 30_1 to 30_8 corresponding to the respective memory banks 10_1 to 10_8, and a plurality of write driver and sense amplifiers 40_1 to 40_8.

With the trend of large-capacity and high-integration of a nonvolatile memory device, the nonvolatile memory device may be implemented with a hierarchical bit line structure using a global bit line and a local bit line. For example, a typical nonvolatile memory device may be configured such that each global bit line GBL corresponds to one of the plurality of memory banks 10_1 to 10_8 as described in FIG. 4.

As described in FIG. 4, when the global bit lines GBL correspond to the memory banks 10_1 to 10_8, respectively, the core architecture of a typical nonvolatile memory device may be implemented as described in FIG. 5. Redundancy memory cell arrays 12_1 to 12_8 may be arranged corresponding to the memory banks 10_1 to 10_8, respectively.

A typical nonvolatile memory device having the core structure as described in FIG. 5 may include a significantly increased number of sense amps in the write drivers and sense amplifiers 40_1 to 40_8 according to the number of words pre-fetched during a synchronous burst read operation. For example, if the number of words read from one memory bank (e.g., memory bank 10_1) to be pre-fetched is four, the number of sense amps in one write driver and sense amplifier (e.g., write driver and sense amplifier 40_1) may be one word (16-bit)×4=64. Accordingly, 64×8=512 sense amps are necessary in eight global sense amplifiers 40_1 to 40_8. If calculated by the above method, 1,024 sense amps are required if eight words are pre-fetched, and 2,048 sense amps are required if 16 words are pre-fetched. As the number of pre-fetched words increases, the area of the core structure progressively increases.

In a test operation, to simultaneously write data of a great number of bits (e.g., 8-bit or 16-bit) in one memory bank (e.g., memory bank 10_1) may be difficult. For example, when reset data is written in one nonvolatile memory cell, if a reset current flowing through one nonvolatile memory cell is about 1 mA. If data of 16-bit are simultaneously written in one memory bank 10_1, a reset current of about 16 mA may flow. If a reset current of a too high level flows in one memory bank 10_1 (in a dense space), to write data of a great number of bits simultaneously may be difficult. Accordingly, data of a small number of bits has to be written in the test operation, resulting in elongation of the test time.

Because the nonvolatile memory cells in the memory banks 10_1 to 10_8 and the redundancy memory cells in the redundancy memory cell arrays 12_1 to 12_8 share word lines, the plurality of redundancy memory cell arrays 12_1 to 12_8 may be arranged corresponding to the memory banks 10_1 to 10_8, respectively. Accordingly, the area of the core structure may increase.

Figure 6:
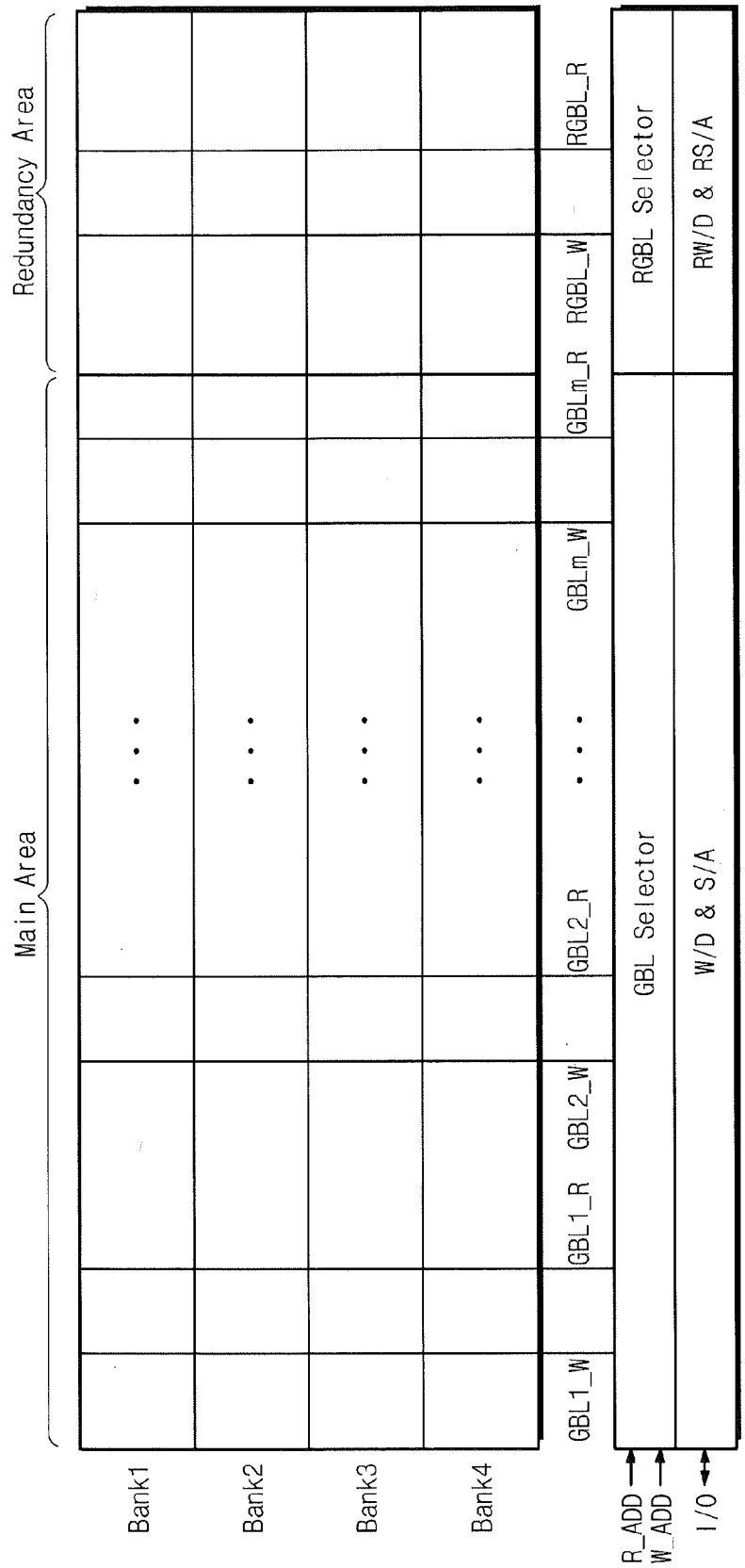
FIG. 6 is a block diagram illustrating a nonvolatile memory device according to an example embodiment.

FIG. 6 is a block diagram illustrating a nonvolatile memory device according to example embodiments. Four memory banks are shown in FIG. 4 for convenience of explanation, but the scope of example embodiments of the inventive concepts will not be limited thereto.

Referring to FIG. 6, a nonvolatile memory device according to example embodiments may include a main area and a redundancy area. The main area may include a plurality of memory banks Bank1 to Bank4, a global bit line selector GBL selector, and a write driver and sense amplifier W/D & S/A. The GBL selector may take as inputs a write address W_ADD and a read address R_ADD. The write driver and sense amplifier W/D & S/A may include an input/output line. The redundancy area may include a plurality of memory banks Bank1 to Bank4, a redundancy global bit line selector RGBL selector, and a redundancy write driver and redundancy sense amplifier RW/D & RS/A.

Although not shown, memory banks Bank1 to Bank4 may include a plurality of nonvolatile memory cells. Each of the nonvolatile memory cells may include a variable resistance element having different resistance level according to stored data, and an access element controlling a tunneling current flowing in the variable resistance element. The access element may include a diode, a FET transistor, an NPN bipolar transistor, and a PNP bipolar transistor, but is not limited thereto.

A plurality of banks Bank1 to Bank4 may share global write bit lines GBL1_W to GBLm_W and global read bit lines GBL1_R to GBLm_R. Although not shown, the global write bit line and the global read bit line may be selectively connected to a local bit line of one of the banks Bank1 to Bank4.

The GBL selector may select one of the global write bit lines GBL1_W to GBLm_W. Also, the GBL selector may select one of the global read bit lines GBL1_R to GBLm_R.

The write driver and sense amplifier W/D & S/A may drive the global write bit line and global read bit line selected by the GBL selector with a write current and a read current.

The redundancy area may include redundant write bit lines RGBL_W and redundant read bit lines RGBL_R. The redundancy area may be provided to repair a defect generated in the main area. Defects may be generated by various causes in the main area. For example, a defect may be generated in the global bit line within the main area in the course of the processing. Also, a defect may be generated in the local bit line within each memory bank in the course of the processing.

If such a defect is generated in the main area, the redundancy area may replace the main area. For example, if there is a defect in the first global write bit line GBL1_W, the first redundancy global write bit line RGBL1_W may replace the first global write bit line GBL1_W. Accordingly, if there is an request for an access to the first global write bit line GBL1_W from the outside, the first redundancy global write bit line RGBL1_W may be accessed instead of the first global write bit line GBL1_W.

According to an example embodiment of the inventive concepts, global write bit lines GBL1_W to GBLm_W and global read bit lines GBL1_R to GBLm_R may be provided. The global write bit lines GBL1_W to GBLm_W may be applied with a bias voltage for the write operation, and the global read bit lines GBL1_R to GBLm_R may be applied with a bias voltage for the read operation. The global write bit lines GBL1_W to GBLm_W and the global read bit lines GBL1_R to GBLm_R may be selectively connected to one local bit line among a plurality of memory banks, respectively.

Figure 7:
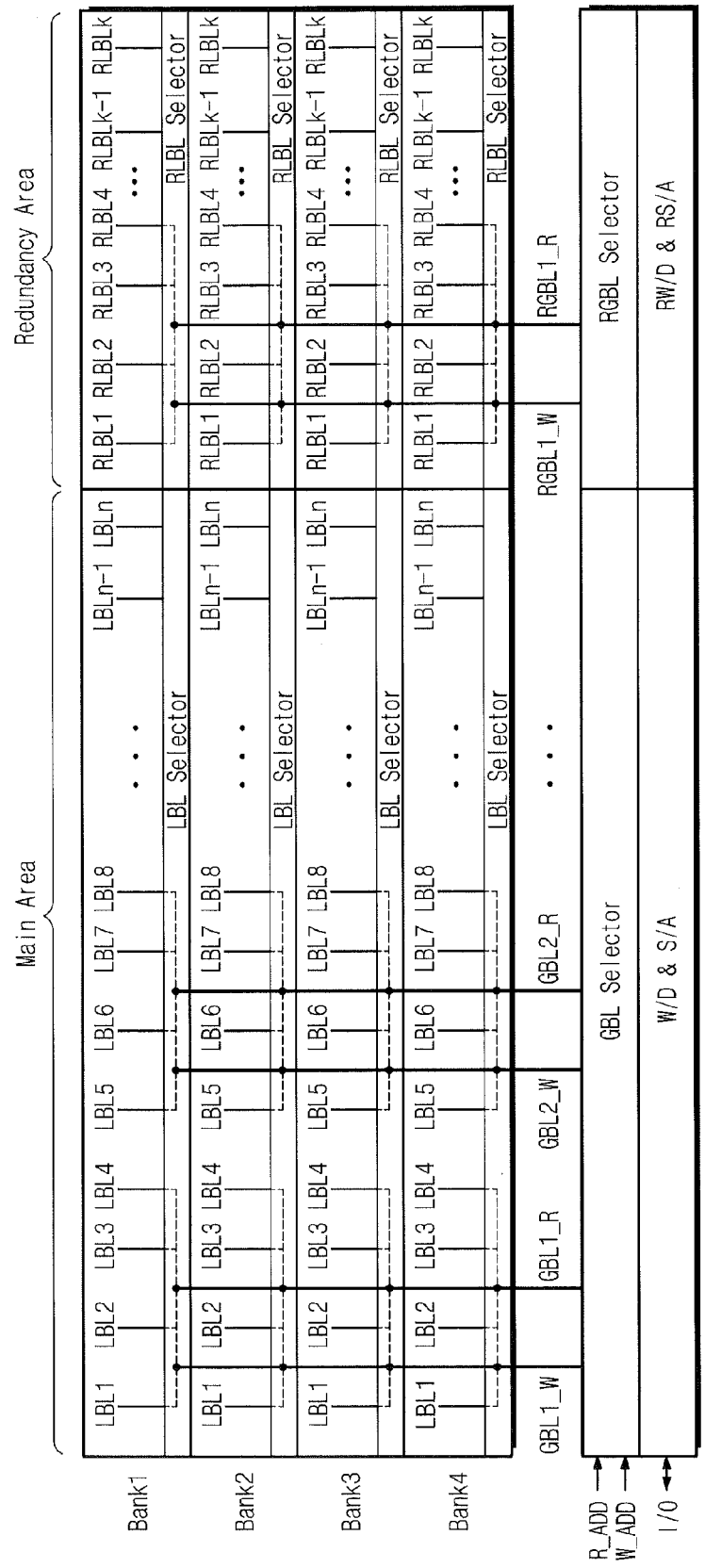
FIG. 7 is a diagram illustrating the nonvolatile memory device of FIG. 6.

FIG. 7 is a diagram illustrating the nonvolatile memory device of FIG. 6. Referring to FIG. 7, a nonvolatile memory device according to an example embodiment may include a main area and a redundancy area.

Memory banks Bank1 to Bank4 in the main area may include a local bit line selector LBL selector. The local bit line selector LBL selector may selectively connect global bit lines (e.g., GBL1_W, GBL1_R) to local bit lines (e.g., LBL1 to LBLn). For example, the local bit line selector LBL selector of the first memory bank Bank1 may selectively connect the first global write bit line GBL1_W to the first to fourth local bit lines LBL1 to LBL4 of the first memory bank Bank1. Also, the local bit line selector LBL selector of the first memory bank Bank1 may selectively connect the first global read bit line GBL1_R to the first to fourth local bit lines LBL1 to LBL4 of the first memory bank Bank1. The redundant local bit line selector RLBL selector may selectively connect redundant global bit lines (e.g., RGBL1_W, RGBL1_R) to redundant local bit lines (e.g., RLBL1 to RLBLk).

The write driver and the sense amplifier W/D & S/A may be connected to the plurality of global bit lines. The write driver and the sense amplifier W/D & S/A may read data from the nonvolatile memory cells in the plurality of memory banks Bank1 to Bank4 through the global read bit lines GBL1_R to GBLm_R. Also, the write driver and the sense amplifier W/D & S/A may write data in the nonvolatile memory cells of the plurality of memory banks Bank1 to Bank4 through the global write bit lines GBL1_W to GBLm_W.

Figure 8:
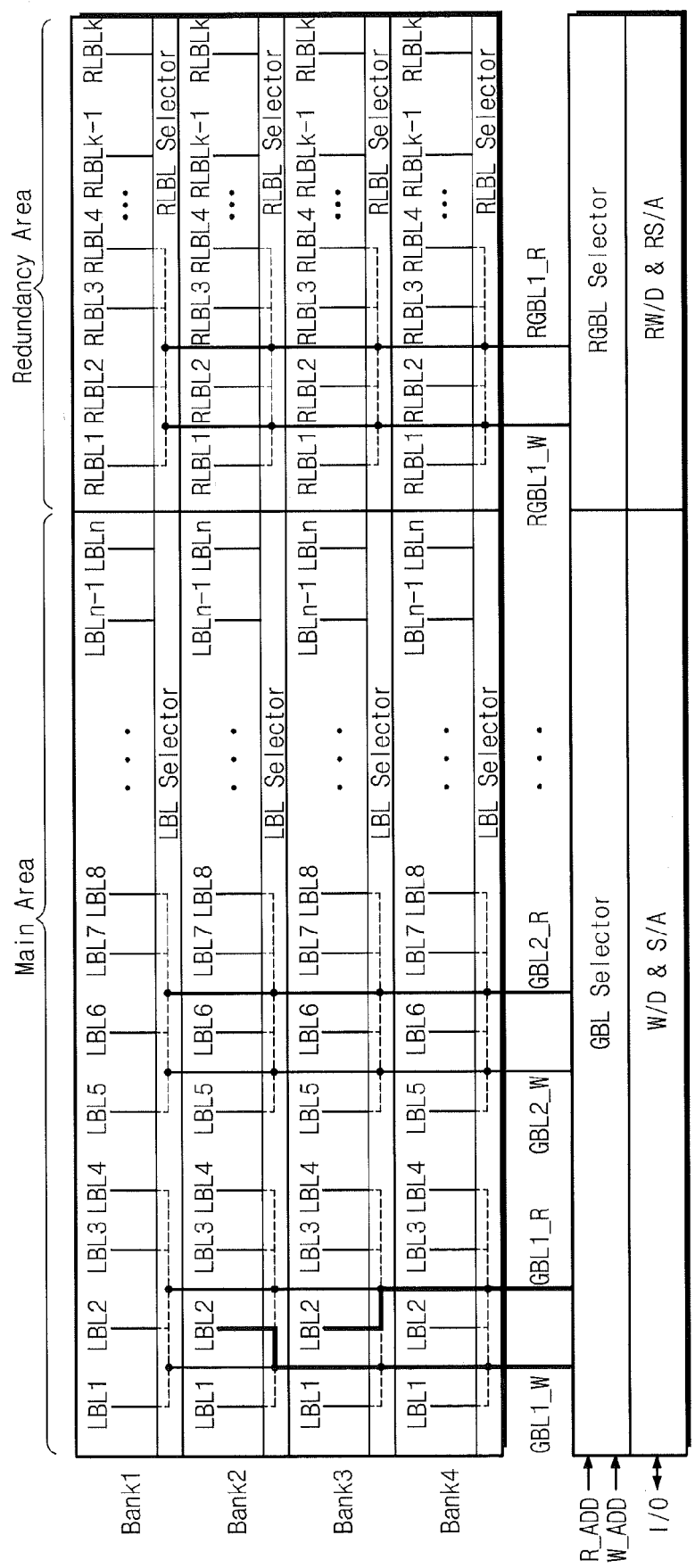
FIG. 8 is a diagram illustrating a read operation of a nonvolatile memory device during a write operation according to an example embodiment.

FIG. 8 is a diagram illustrating a read operation of a nonvolatile memory device during a write operation according to an example embodiment. Hereinafter, it is assumed that a write operation and a read operation are performed on the same column address of different memory banks. Referring to FIG. 8, the write operation may be performed on a memory cell connected to a second local bit line LBL2 of a second memory bank Bank2, and the read operation may be performed on a memory cell electrically connected to the second local bit line LBL2 of a third memory bank Bank3.

In order to perform the write operation on a memory cell electrically connected to the second local bit line LBL2 of the second memory bank Bank2, a global bit line selector GBL selector may activate a first global write bit line GBL1_W. The activated first global write bit line GBL1_W may be driven with a write current. A local bit line selector LBL selector of the second memory bank Bank2 may connect the first global write bit line GBL1_W to the second local bit line LBL2 of the second memory bank Bank2. Accordingly, the write current applied to the first global write bit line GBL1_W may be delivered to the second local bit line LBL2. For example, the respective local bit line selectors of the first memory bank Bank1, the third memory bank Bank3, and the fourth memory bank Bank4 may not electrically connect the first global write bit line GBL1_W to the respective local bit lines.

As described above, the write operation may be performed on one of the plurality of memory banks by selectively connecting the global write bit line to the local bit line of one of the plurality of memory banks Bank1 to Bank4.

Also, in order to perform the read operation on a memory cell electrically connected to the second local bit line LBL2 of the second memory bank Bank2, the global bit line selector GBL selector may activate a first global read bit line GBL1_R. The activated first global read bit line GBL1_R may be driven with a read current. A local bit line selector LBL selector of the third memory bank Bank3 may connect the first global read bit line GBL1_R to the second local bit line LBL2 of the third memory bank Bank3. Accordingly, the read current applied to the first global read bit line GBL1_R may be delivered to the second local bit line LBL2. For example, the local bit line selectors of the first memory bank Bank1, the second memory bank Bank2, and the fourth memory bank Bank4 may not electrically connect the first global read bit line GBL1_R to the respective local bit lines.

As described above, the read operation may be performed on one of the plurality of memory banks by selectively connecting the global read bit line to the local bit line of one of the plurality of memory banks Bank1 to Bank4. The access speed of the nonvolatile memory device may be increased by performing a read operation on a different memory bank during a write operation for one memory bank.

Figure 9:
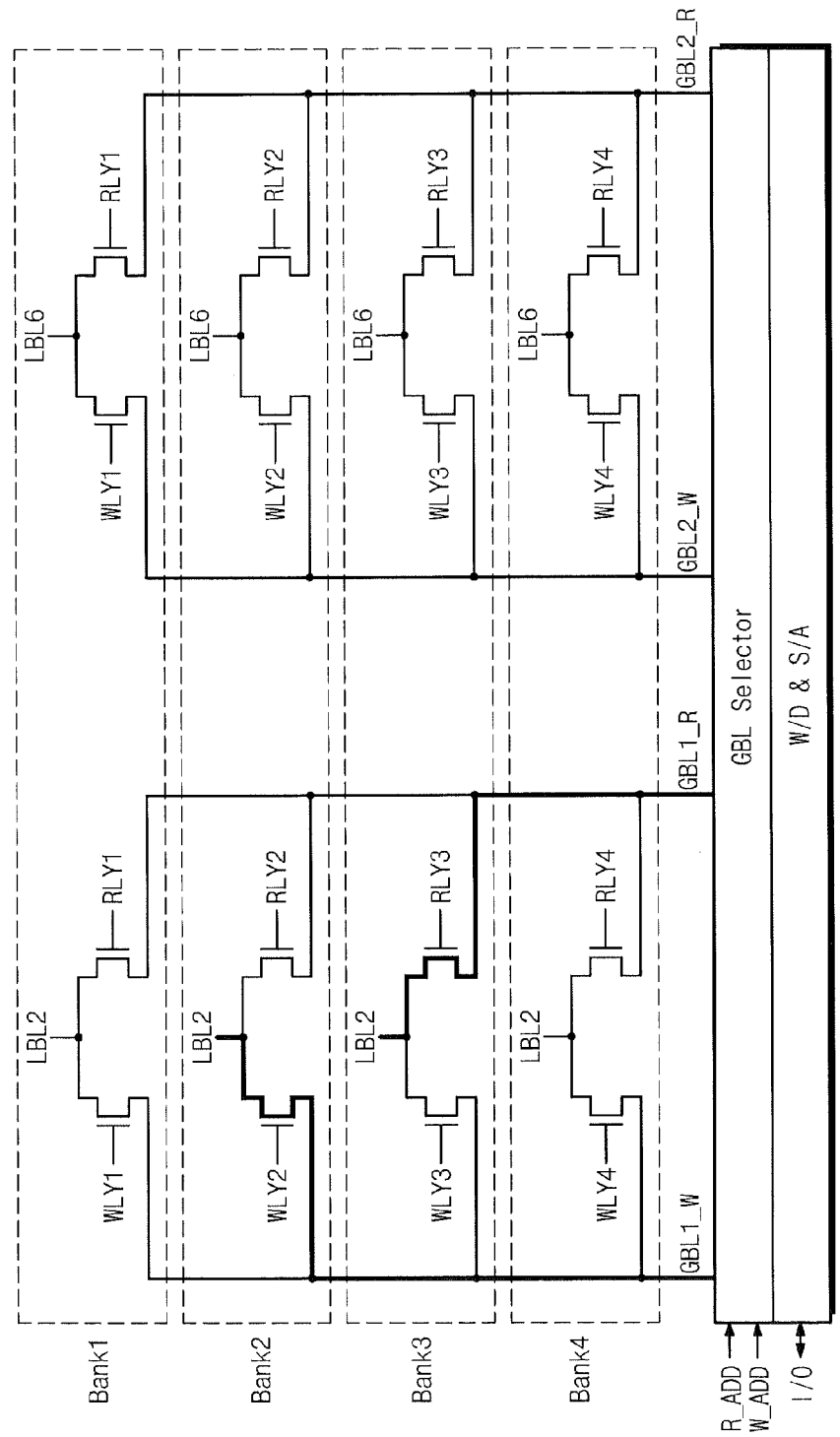
FIG. 9 is a diagram illustrating the nonvolatile memory device of FIG. 8.

FIG. 9 is a diagram illustrating the nonvolatile memory device of FIG. 8. FIG. 9 further illustrates write line signals (e.g., WLY1 to WLY4) and read line signals (e.g., RLY1 to RLY4). Referring to FIG. 9, a write operation may be performed on a memory cell electrically connected to the second local bit line LBL2 of the second memory bank Bank2, and a read operation may be performed on a memory cell electrically connected to the second local bit line LBL2 of the third memory bank Bank3 as described in FIG. 8.

In order to perform the write operation on a memory cell connected to the second local bit line LBL2 of the second memory bank Bank2, a global bit line selector GBL selector may activate a first global write bit line GBL1_W. The activated first global write bit line GBL1_W may be driven with a write current. Also, the global bit line selector GBL selector may activate a second write signal WLY2. The second write signal WLY2 may be applied to the second memory bank Bank2. A local bit line selector LBL selector of the second memory bank Bank2 may electrically connect the first global write bit line GBL1_W to the second local bit line LBL2 of the second memory bank Bank2 in response to the activated second write signal WLY2. Accordingly, the write current applied to the first global write bit line GBL1_W may be delivered to the second local bit line LBL2.

The global bit line selector GBL selector may inactivate a first write signal WLY1, a third write signal WLY3, and a fourth write signal WLY4. The local bit line selectors LBL selector of the first memory bank Bank1, the third memory bank Bank3, and the fourth memory bank Bank4 may not connect the first global read bit line GBL1_W to the respective local bit lines in response to the first write signal WLY1, the third write signal WLY3, and the fourth write signal WLY4.

As described above, the write operation may be performed on one of the plurality of memory banks by selectively connecting the global write bit line to the local bit line of one of the plurality of memory banks.

In order to perform the read operation on a memory cell electrically connected to the second local bit line LBL2 of the third memory bank Bank3, a global bit line selector GBL selector may activate a first global read bit line GBL1_R. The activated first global read bit line GBL1_R may be driven with a read current. A local bit line selector LBL selector of the third memory bank Bank3 may connect the first global read bit line GBL1_R to the second local bit line LBL2 of the third memory bank Bank3. Accordingly, the read current applied to the first global write bit line GBL1_R may be delivered to the second local bit line LBL2. For example, the local bit line selectors of the first memory bank Bank1, the second memory bank Bank2, and the fourth memory bank Bank4 may not electrically connect the first global read bit line GBL1_R to the local bit lines.

As described above, the read operation may be performed on one of the plurality of memory banks by selectively connecting the global read bit line to the local bit line of one of the plurality of memory banks Bank1 to Bank4. The access speed of the nonvolatile memory device may be increased by performing a read operation on a different memory bank during a write operation for one memory bank.

Figure 10:
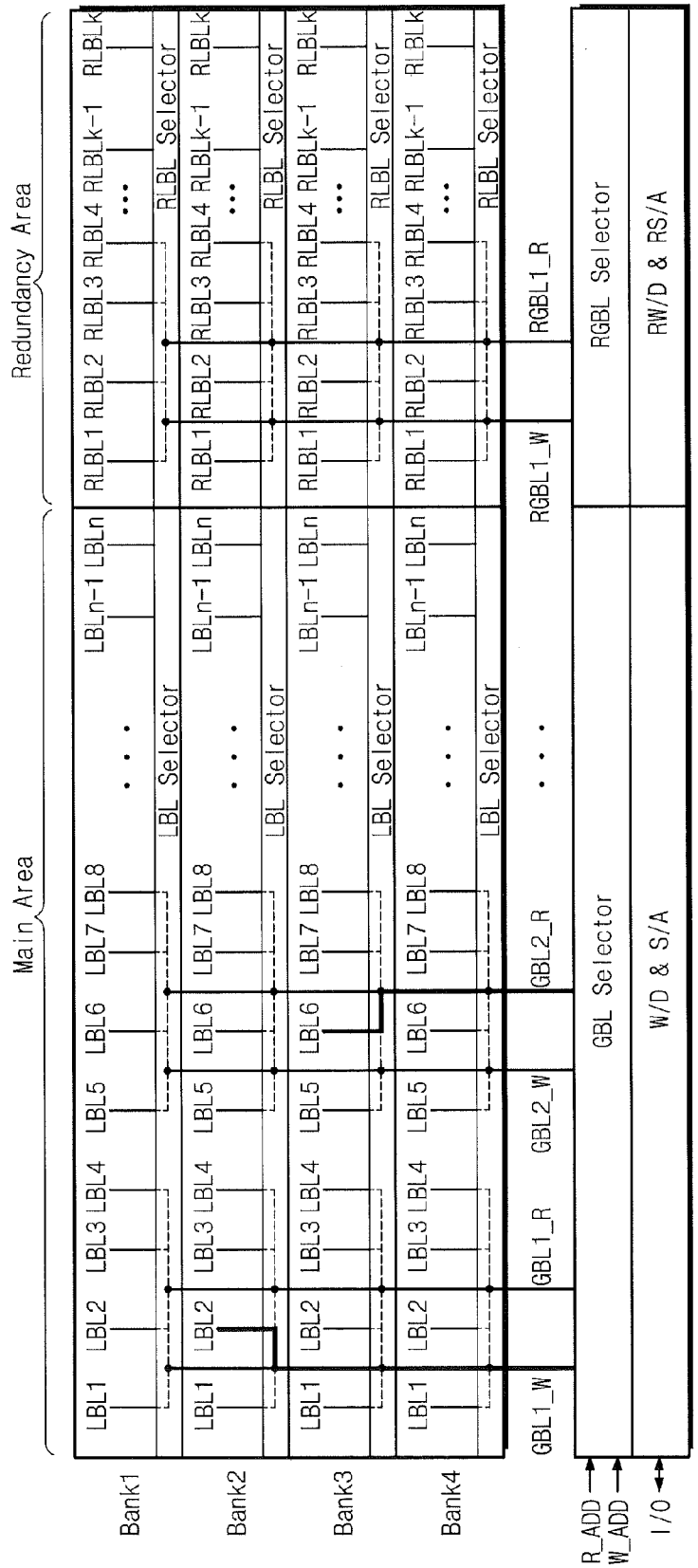
FIG. 10 is a diagram illustrating a read operation of a nonvolatile memory device during a write operation according to an example embodiment.

FIG. 10 is a diagram illustrating a read operation of a nonvolatile memory device during a write operation according to example embodiments. Hereinafter, a write operation and a read operation are performed on different column addresses of different memory banks is assumed. Referring to FIG. 10, the write operation may be performed on a memory cell connected to a second local bit line LBL2 of a second memory bank Bank2, and the read operation may be performed on a memory cell connected to a sixth local bit line LBL6 of a third memory bank Bank3.

In order to perform the write operation on a memory cell electrically connected to the second local bit line LBL2 of the second memory bank Bank2, a global bit line selector GBL selector may activate a first global write bit line GBL1_W. The activated first global write bit line GBL1_W may be driven with a write current. A local bit line selector LBL selector of the second memory bank Bank2 may electrically connect the first global write bit line GBL1_W to the second local bit line LBL2 of the second memory bank Bank2. Accordingly, the write current applied to the first global write bit line GBL1_W may be delivered to the second local bit line LBL2. For example, the local bit line selectors of the first memory bank Bank1, the third memory bank Bank3, and the fourth memory bank Bank4 may not connect the first global write bit line GBL1_W to the local bit lines.

As described above, the write operation may be performed on one of the plurality of memory banks by selectively connecting the global write bit line to the local bit line of one of the plurality of memory banks Bank1 to Bank4.

Also, In order to perform the read operation on a memory cell electrically connected to the sixth local bit line LBL6 of the third memory bank Bank3, the global bit line selector GBL selector may activate a second global read bit line GBL2_R. The activated second global read bit line GBL2_R may be driven with a read current. A local bit line selector LBL selector of the third memory bank Bank3 may electrically connect the second global read bit line GBL2_R to the sixth local bit line LBL6 of the third memory bank Bank3.

Accordingly, the read current applied to the second global read bit line GBL2_R may be delivered to the sixth local bit line LBL6. For example, the local bit line selectors of the first memory bank Bank1, the second memory bank Bank2, and the fourth memory bank Bank4 may not electrically connect the second global read bit line GBL2_R to the local bit lines.

As described above, the read operation may be performed on one of the plurality of memory banks by selectively connecting the global read bit line to the local bit line of one of the plurality of memory banks Bank1 to Bank4. The access speed of the nonvolatile memory device may be increased by performing a read operation on a different memory bank during a write operation for one memory bank.

Figure 11:
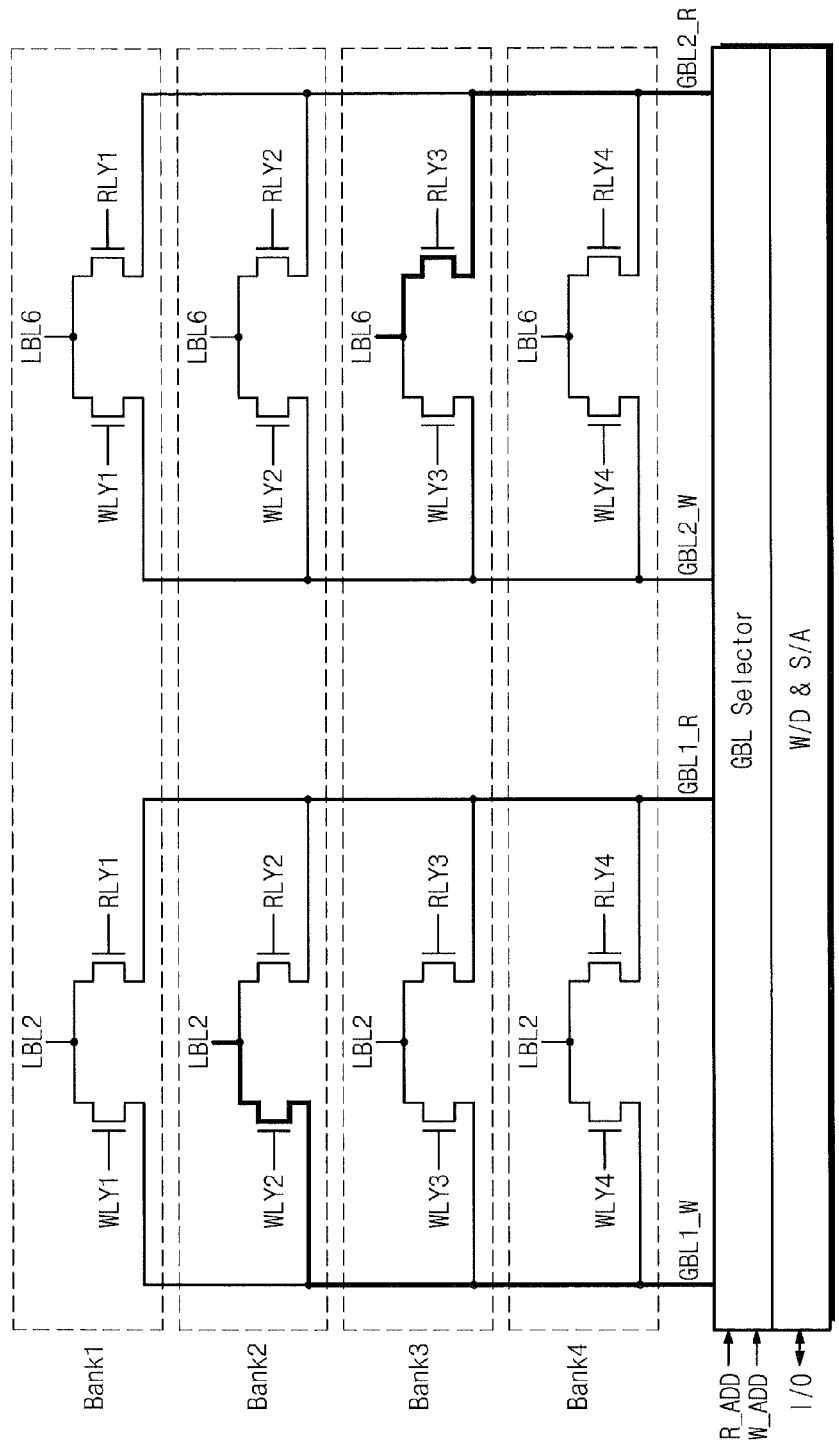
FIG. 11 is a diagram illustrating the nonvolatile memory device of FIG. 10.

FIG. 11 is a diagram illustrating the nonvolatile memory device of FIG. 10. Referring to FIG. 11, a write operation may be performed on a memory cell electrically connected to the second local bit line LBL2 of the second memory bank Bank2, and a read operation may be performed on a memory cell electrically connected to the sixth local bit line LBL6 of the third memory bank Bank3 as described in FIG. 10.

In order to perform the write operation on a memory cell electrically connected to the second local bit line LBL2 of the second memory bank Bank2, a global bit line selector GBL selector may activate a first global write bit line GBL1_W. The activated first global write bit line GBL1_W may be driven with a write current. Also, the global bit line selector GBL selector may activate a second write signal WLY2. The second write signal WLY2 may be applied to the second memory bank Bank2.

A local bit line selector LBL selector of the second memory bank Bank2 may connect the first global write bit line GBL1_W to the second local bit line LBL2 of the second memory bank Bank2 in response to the activated second write signal WLY2. Accordingly, the write current applied to the first global write bit line GBL1_W may be delivered to the second local bit line LBL2.

The global bit line selector GBL selector may inactivate a first write signal WLY1, a third write signal WLY3, and a fourth write signal WLY4. The local bit line selectors LBL selector of the first memory bank Bank1, the third memory bank Bank3, and the fourth memory bank Bank4 may not electrically connect the first global read bit line GBL1_W to the local bit lines in response to the first write signal WLY1, the third write signal WLY3, and the fourth write signal WLY4.

As described above, the write operation may be performed on one of the plurality of memory banks by selectively connecting the global write bit line to the local bit line of one of the plurality of memory banks.

In order to perform the read operation on a memory cell connected to the six local bit line LBL6 of the third memory bank Bank3, a global bit line selector GBL selector may activate a second global read bit line GBL2_R. The activated second global read bit line GBL2_R may be driven with a read current. A local bit line selector LBL selector of the third memory bank Bank3 may electrically connect the second global read bit line GBL2_R to the sixth local bit line LBL6 of the third memory bank Bank3. Accordingly, the read current applied to the second global write bit line GBL2_R may be delivered to the sixth local bit line LBL6. For example, the local bit line selectors of the first memory bank Bank1, the second memory bank Bank2, and the fourth memory bank Bank4 may not electrically connect the second global read bit line GBL2_R to the local bit lines.

As described above, the read operation may be performed on one of the plurality of memory banks by selectively connecting the global read bit line to the local bit line of one of the plurality of memory banks Bank1 to Bank4. The access speed of the nonvolatile memory device may be increased by performing the write operation and the read operation on different column addresses simultaneously.

Figure 12:
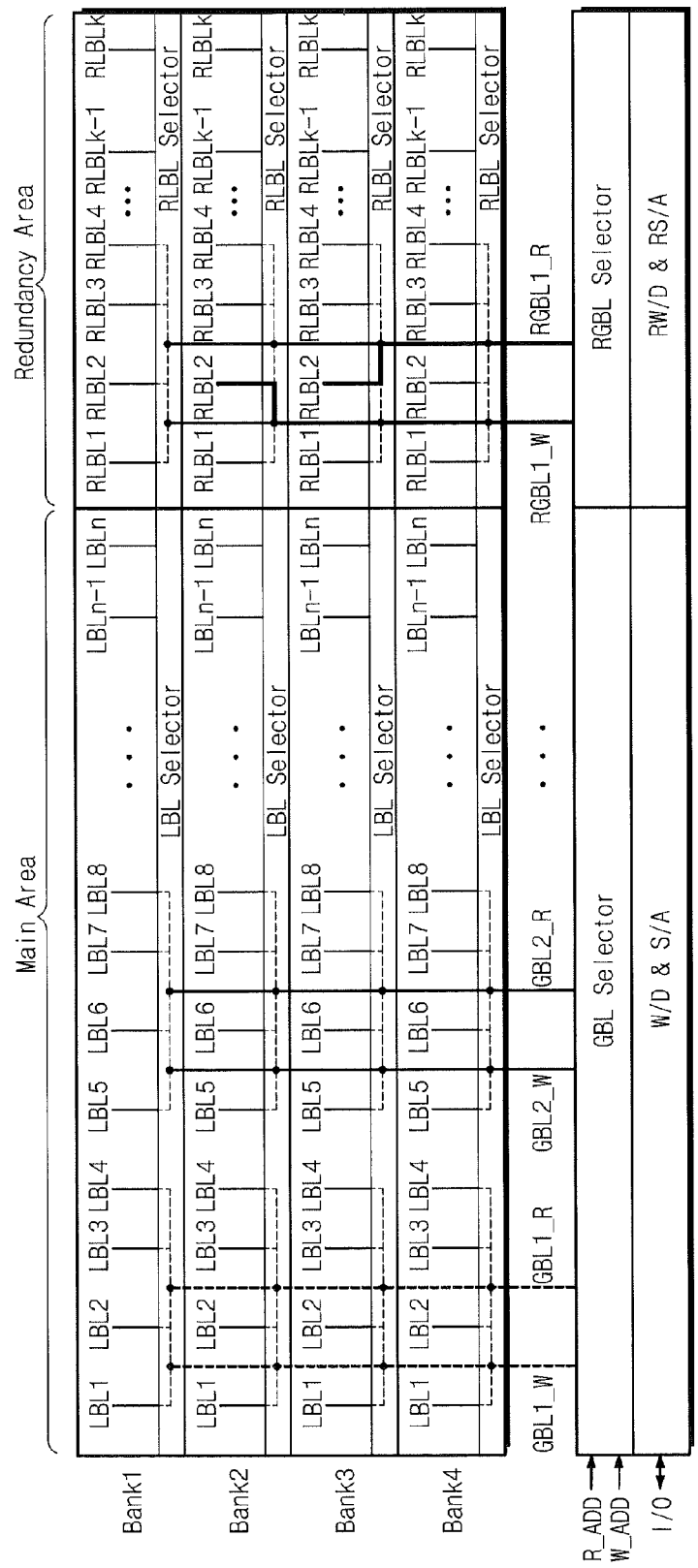
FIG. 12 is a diagram illustrating a read operation of a nonvolatile memory device during a write operation according to a third embodiment.

FIG. 12 is a diagram illustrating a read operation of a nonvolatile memory device during a write operation according to example embodiments. Hereinafter, a defect in a first global write bit line GBL1_W or a first global read bit line GBL1_R is assumed. The dotted line of FIG. 12 represents a defect. Examples of the defect may include defects of a global bit line, a local bit line connected to the global bit line, and a memory cell connected to the local bit line.

Referring to FIG. 12, a write operation may be performed on a memory cell electrically connected to a second local bit line LBL2 of a second memory bank Bank2, and a read operation may be performed on a memory cell electrically connected to a second local bit line LBL2 of a third memory bank Bank3. Because there is a defect in the first global write bit line GBL1_W or the first global read bit line GBL1_R, the global bit line having the defect may be replaced with a redundancy global bit line. Because the first global write bit line GBL1_W and the first global read bit line GBL1_R are paired up, both of them have to be replaced with redundancy global bit lines when there is a defect in either of them.

If a write command for the first global write bit line GBL1_W having a defect is input from the outside, a redundancy global bit line selector RGBL selector may activate a first redundancy global write bit line RGBL1_W. For example, a global bit line selector GBL selector may not activate a first global write bit line GBL1_W. The activated first redundancy global write bit line RGBL1_W may be driven with a write current. A redundancy local bit line selector RLBL selector of a second memory bank Bank2 may connect the first redundancy global write bit line RGBL1_W to a second redundancy local bit line RLBL2 of the second memory bank Bank2.

Accordingly, the write current applied to the first redundancy global write bit line RGBL1_W may be delivered to the second redundancy local bit line RLBL2. For example, the redundancy local bit line selectors RLBL selector of a first memory bank Bank1, a third memory bank Bank3, and a fourth memory bank Bank4 may not electrically connect the first redundancy write bit line RGBL1_W to the local bit lines.

As described above, the write operation may be performed on one of the plurality of memory banks by replacing a global write bit line having a defect with a redundancy global write bit line.

If a read command for the first global read bit line GBL1_R having a defect is inputted from the outside, the redundancy global bit line selector RGBL selector may activate a first redundancy global read bit line RGBL1_R. For example, the global bit line selector GBL selector may not activate a first global read bit line GBL1_R. The activated first redundancy global read bit line RGBL1_R may be driven with a read current. The redundancy local bit line selector RLBL selector of the second memory bank Bank2 may connect the first redundancy global read bit line RGBL1_R to the second redundancy local bit line RLBL2 of the second memory bank Bank2.

Accordingly, the read current applied to the first redundancy global read bit line RGBL1_R may be delivered to the second redundancy local bit line RLBL2. For example, the redundancy local bit line selectors RLBL selector of a first memory bank Bank1, a third memory bank Bank3, and a fourth memory bank Bank4 may not electrically connect the first redundancy read bit line RGBL1_R to the respective local bit lines.

As described above, the read operation may be performed on one of the plurality of memory banks by replacing a global read bit line having a defect with a redundancy global read bit line. The access speed of the nonvolatile memory device may be increased by performing a read operation on a different memory bank during a write operation for one memory bank even when there is a defect in the global read bit line.

Figure 13:
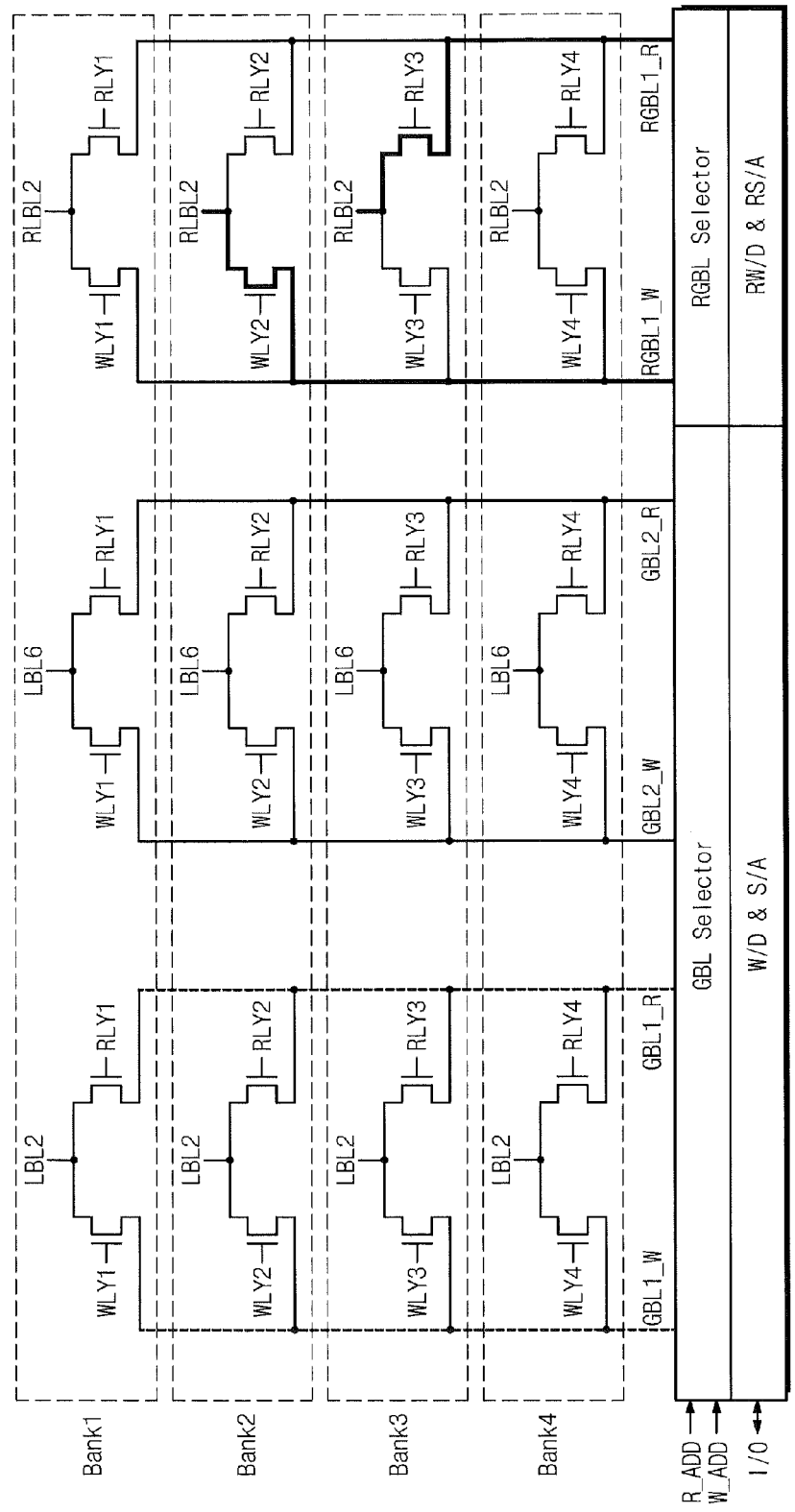
FIG. 13 is a diagram illustrating the nonvolatile memory device of FIG. 12.

FIG. 13 is a diagram illustrating the nonvolatile memory device of FIG. 12.

Hereinafter, a method for accessing a redundancy bit line instead of a global bit line having a defect as described in FIG. 12 will be described in detail.

If a write command for a first global read bit line GBL1_R having a defect is input from the outside, a redundancy global bit line selector RGBL selector may activate a first redundancy global write bit line RGBL1_W. For example, the GBL selector may not activate a first global write bit line GBL1_W. The activated first redundancy global write bit line RGBL1_W may be driven with a write current.

The redundancy global bit line selector RGBL selector may apply the activated second write signal WLY2 to a second memory bank Bank2. A redundancy local bit line selector RLBL selector of the second memory bank Bank 2 may electrically connect the first redundancy global write bit line RGBL1_W to the second redundancy local bit line RLBL2 of the second memory bank Bank2 in response to the activated second write signal WLY2. Accordingly, the write current applied to the first redundancy global write bit line RGBL1_W may be delivered to the second redundancy local bit line RLBL2.

The redundancy global bit line selector RGBL selector may inactivate a first write signal WLY1, a third write signal WLY3, and a fourth write signal WLY4. The redundancy local bit line selectors RLBL selector of the first memory bank Bank1, the third memory bank Bank3, and the fourth memory bank Bank4 may not electrically connect the first redundancy global read bit line RGBL1_W to the redundancy local bit lines in response to the first write signal WLY1, the third write signal WLY3, and the fourth write signal WLY4.

As described above, the write operation may be performed on one of the plurality of memory banks by replacing a global write bit line having a defect with a redundancy global write bit line.

If a read command for a first global read bit line GBL1_R having a defect is input from the outside, the redundancy global bit line selector RGBL selector may activate a first redundancy global read bit line RGBL1_R. For example, the GBL selector may not activate a first global write bit line GBL1_R. The activated first redundancy global read bit line RGBL1_R may be driven with a read current.

The redundancy local bit line selector RLBL selector of the second memory bank Bank2 may electrically connect the first redundancy global read bit line RGBL1_R to the second redundancy local bit line RLBL2 of the second memory bank Bank2. Accordingly, the write current applied to the first redundancy global read bit line RGBL1_R may be delivered to the second redundancy local bit line RLBL2. For example, the local bit line selectors of the first memory bank Bank1, the third memory bank Bank3, and the fourth memory bank Bank4 may not electrically connect the first global read bit line GBL1_R to the local bit lines.

As described above, the read operation may be performed on one of the plurality of memory banks by replacing a global read bit line having a defect with a redundancy global read bit line. The access speed of the nonvolatile memory device may be increased by performing a read operation on a different memory bank during a write operation for one memory bank even when there is a defect in the global read bit line.

Figure 14:
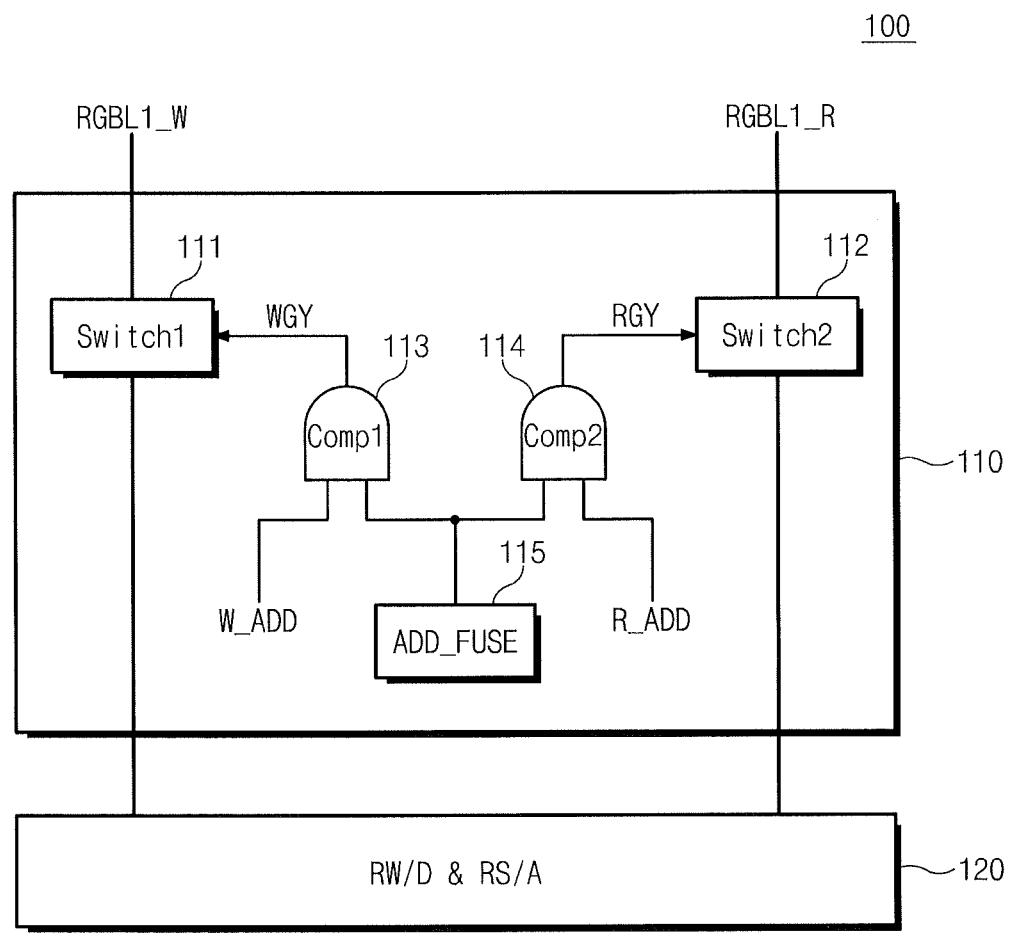
FIG. 14 is a diagram illustrating a Redundancy Global Bit Line (RGBL) selector of FIG. 13.

FIG. 14 is a diagram illustrating the redundancy global bit line selector of FIG. 13. Referring to FIG. 14, the redundancy global bit line selector RGBL selector 110 may include a first switch 111 and a second switch 112, a first comparator 113 and a second comparator 114, and an address fuse 115.

The address fuse 115 may store an address of a global bit line to be replaced. For example, if the first redundancy global write bit line RGBL1_W may replace the first global write bit line GBL1_W, and the first redundancy global read bit line RGBL1_R may replace the first global read bit line GBL1_R, the address fuse 115 may store addresses corresponding to the first global write bit line GBL1_W and the first global read bit line GBL1_R.

The first comparator 113 may compare a write address W_ADD input from the outside with the address stored in the address fuse 115. If the write address W_ADD input from the outside is identical to the address stored in the address fuse 115, the first comparator 113 may activate a write signal WGY. The first switch 111 may connect the first redundancy global write bit line RGBL1_W to a redundancy write driver and redundancy sense amplifier RW/D & RS/A 120 in response to the activated write signal WGY. Thus, the first global write bit line GBL1_W having a defect may be replaced with a first redundancy global write bit line RGBL1_W.

The second comparator 114 may compare a read address R_ADD input from the outside with the address stored in the address fuse 115. If the read address R_ADD input from the outside is identical to the address stored in the address fuse 115, the first comparator 113 may activate a read signal RGY. The second switch 112 may connect the first redundancy global read bit line RGBL1_R to a redundancy write driver and redundancy sense amplifier RW/D & RS/A in response to the activated write signal RGY. Thus, the first global read bit line GBL1_R having a defect may be replaced with a first redundancy global read bit line RGBL1_R.

Figure 15:
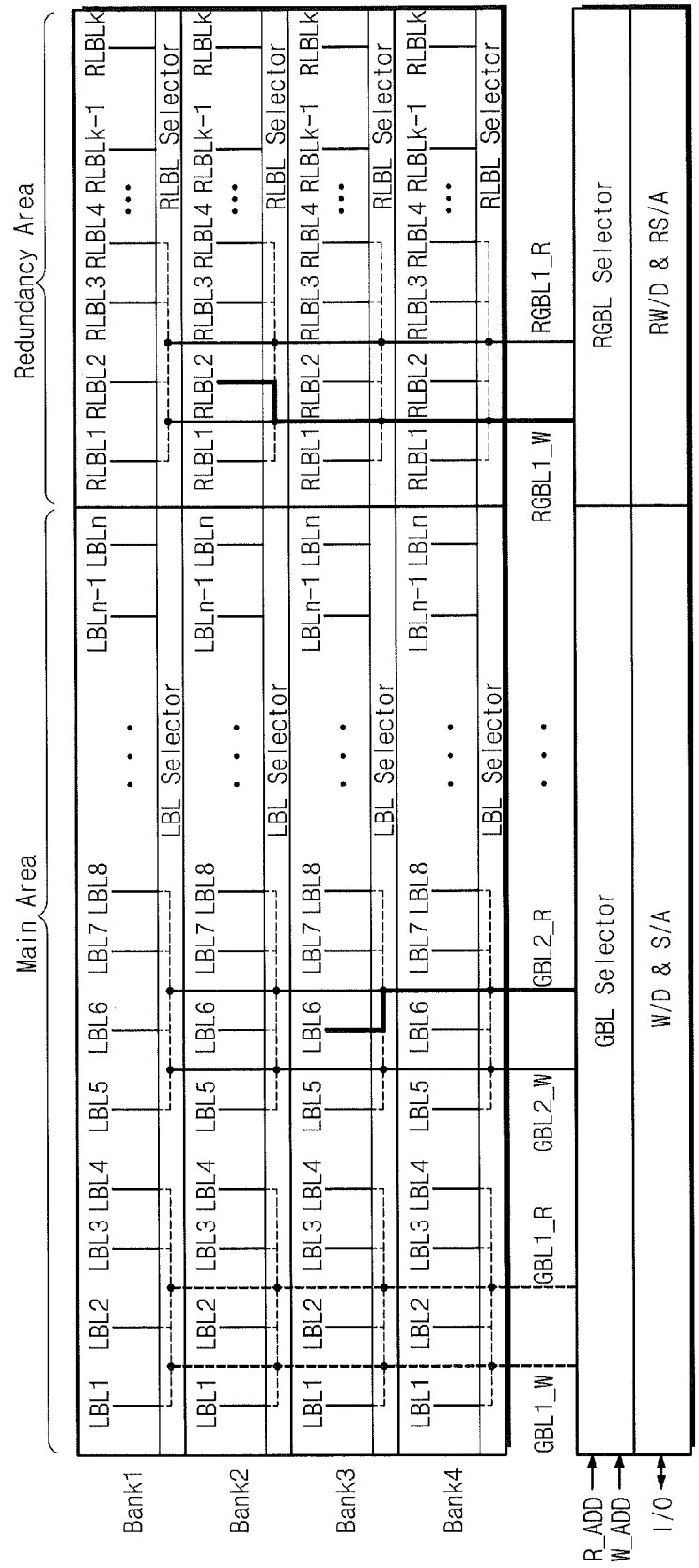
FIG. 15 is a diagram illustrating a read operation of a nonvolatile memory device during a write operation according to an example embodiment.

FIG. 15 is a diagram illustrating a read operation of a nonvolatile memory device during a write operation according to example embodiments. Hereinafter, a defect in a first global write bit line GBL1_W or a first global read bit line GBL1_R is assumed. Examples of the defect may include defects of a global bit line, a local bit line connected to the global bit line, and a memory cell connected to the local bit line.

Referring to FIG. 15, a write operation may be performed on a memory cell electrically connected to a second local bit line LBL2 of a second memory bank Bank2, and a read operation may be performed on a memory cell electrically connected to a sixth local bit line LBL6 of a third memory bank Bank3.

Because there is a defect in the first global write bit line GBL1_W or the first global read bit line GBL1_R, the global bit line having the defect may be replaced with a redundancy global bit line. Because the first global write bit line GBL1_W and the first global read bit line GBL1_R are paired up, both of them may be replaced with redundancy global bit lines if there is a defect in either of them.

If a write command for the first global read bit line GBL1_R having a defect is input from the outside, a redundancy global bit line selector RGBL selector may activate a first redundancy global write bit line RGBL1_W. For example, a global bit line selector GBL selector may not activate a first global write bit line GBL1_W. The activated first redundancy global write bit line RGBL1_W may be driven with a write current. A redundancy local bit line selector RLBL selector of a second memory bank Bank2 may connect the first redundancy global write bit line RGBL1_W to a second redundancy local bit line RLBL2 of the second memory bank Bank2.

Accordingly, the write current applied to the first redundancy global write bit line RGBL1_W may be delivered to the second redundancy local bit line RLBL2. For example, the redundancy local bit line selectors RLBL selector of a first memory bank Bank1, a third memory bank Bank3, and a fourth memory bank Bank4 may not electrically connect the first redundancy write bit line RGBL1_W to the local bit lines.

As described above, the write operation may be performed on one of the plurality of memory banks by replacing a global write bit line having a defect with a redundancy global write bit line.

Also, in order to perform a read operation on a memory cell connected to the six local bit line LBL6 of the third memory bank Bank3, the global bit line selector GBL selector may activate a second global read bit line GBL2_R. The activated second global read bit line GBL2_R may be driven with a read current. The local bit line selector LBL selector of the third memory bank Bank3 may electrically connect the second global read bit line GBL2_R to the sixth local bit line LBL6 of the third memory bank Bank3.

Accordingly, the read current applied to the second global read bit line GBL2_R may be delivered to the sixth local bit line LBL6. For example, the local bit line selectors LBL selector of a first memory bank Bank1, a second memory bank Bank2, and a fourth memory bank Bank4 may not electrically connect the second read bit line GBL2_R to the local bit lines.

As described above, the read operation may be performed on one of the plurality of memory banks by replacing a global read bit line having a defect with a redundancy global read bit line. The access speed of the nonvolatile memory device may be increased by performing a read operation on a different memory bank during a write operation for one memory bank even if there is a defect in the global read bit line.

Figure 16:
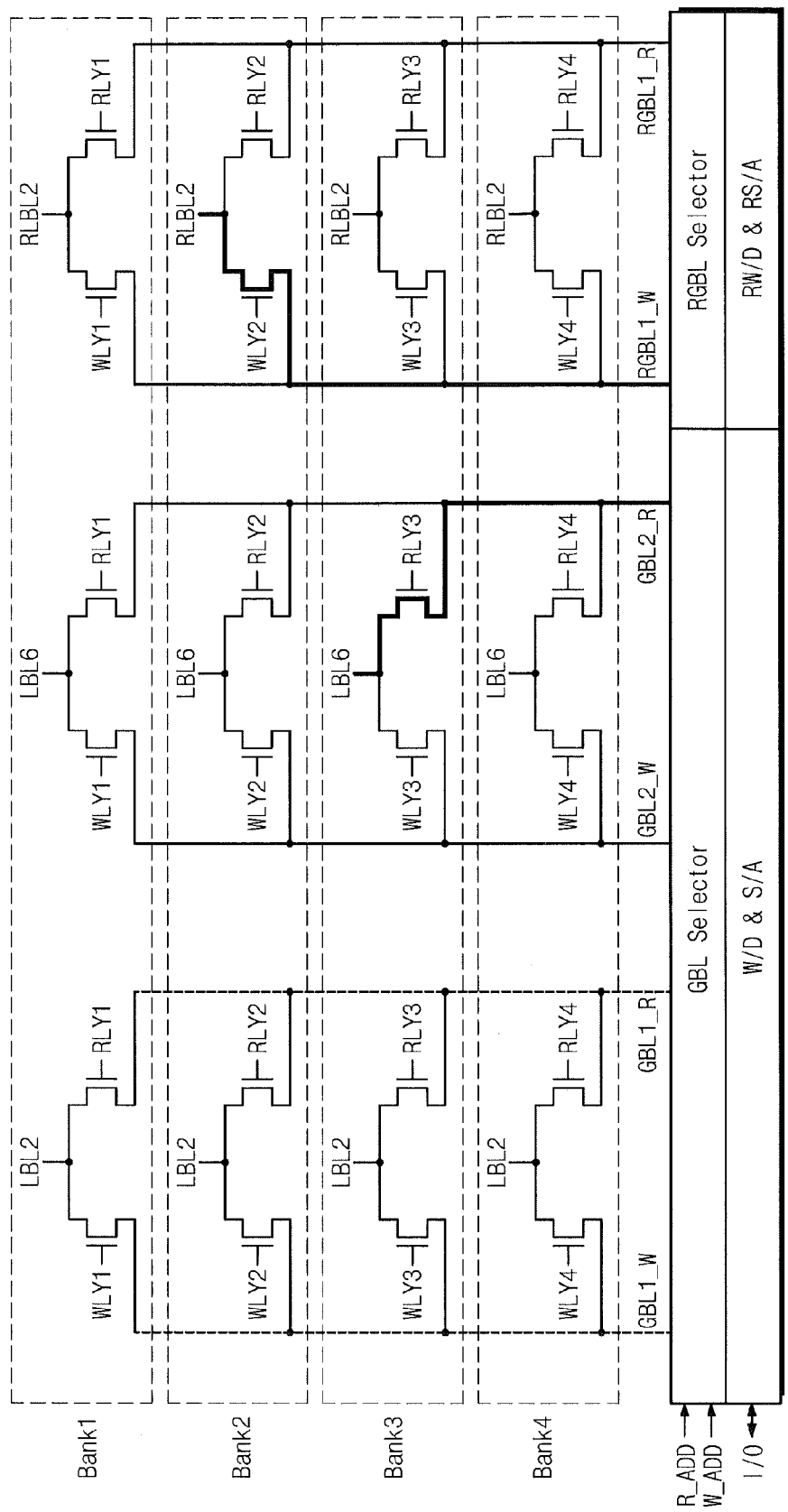
FIG. 16 is a diagram illustrating the nonvolatile memory device of FIG. 15.

FIG. 16 is a diagram illustrating the nonvolatile memory device of FIG. 15

Hereinafter, a method for accessing a redundancy bit line instead of a global bit line having a defect as described in FIG. 15 will be described in detail.

If a write command for a first global write bit line GBL1_W having a defect is input from the outside, a redundancy global bit line selector RGBL selector may activate a first redundancy global write bit line RGBL1_W. For example, the GBL selector may not activate a first global write bit line GBL1_W. The activated first redundancy global write bit line RGBL1_W may be driven with a write current.

The redundancy global bit line selector RGBL selector may apply the activated second write signal WLY2 to a second memory bank Bank2. A redundancy local bit line selector RLBL selector of the second memory bank Bank 2 may electrically connect the first redundancy global write bit line RGBL1_W to the second redundancy local bit line RLBL2 of the second memory bank Bank2 in response to the activated second write signal WLY2. Accordingly, the write current applied to the first redundancy global write bit line RGBL1_W may be delivered to the second redundancy local bit line RLBL2.

The redundancy global bit line selector RGBL selector may inactivate a first write signal WLY1, a third write signal WLY3, and a fourth write signal WLY4. The respective redundancy local bit line selectors RLBL selector of the first memory bank Bank1, the third memory bank Bank3, and the fourth memory bank Bank4 may not connect the first redundancy global read bit line RGBL1_W to the redundancy local bit lines in response to the first write signal WLY1, the third write signal WLY3, and the fourth write signal WLY4.

As described above, the write operation may be performed on one of the plurality of memory banks by replacing a global write bit line having a defect with a redundancy global write bit line.

Also, in order to perform a read operation on a memory cell connected to the six local bit line LBL6 of the third memory bank Bank3, the global bit line selector GBL selector may activate a second global read bit line GBL2_R. The activated second global read bit line GBL2_R may be driven with a read current. The local bit line selector LBL selector of the third memory bank Bank3 may electrically connect the second global read bit line GBL2_R to the sixth local bit line LBL6 of the third memory bank Bank3. Accordingly, the read current applied to the second global read bit line GBL2_R may be delivered to the sixth local bit line LBL6. For example, the local bit line selectors LBL selector of a first memory bank Bank1, a second memory bank Bank2, and a fourth memory bank Bank4 may not electrically connect the second read bit line GBL2_R to the local bit lines.

As described above, the read operation may be performed on one of the plurality of memory banks by replacing a global read bit line having a defect with a redundancy global read bit line. The access speed of the nonvolatile memory device may be increased by performing a read operation on a different memory bank during a write operation for one memory bank even when there is a defect in the global read bit line.

Figure 17:
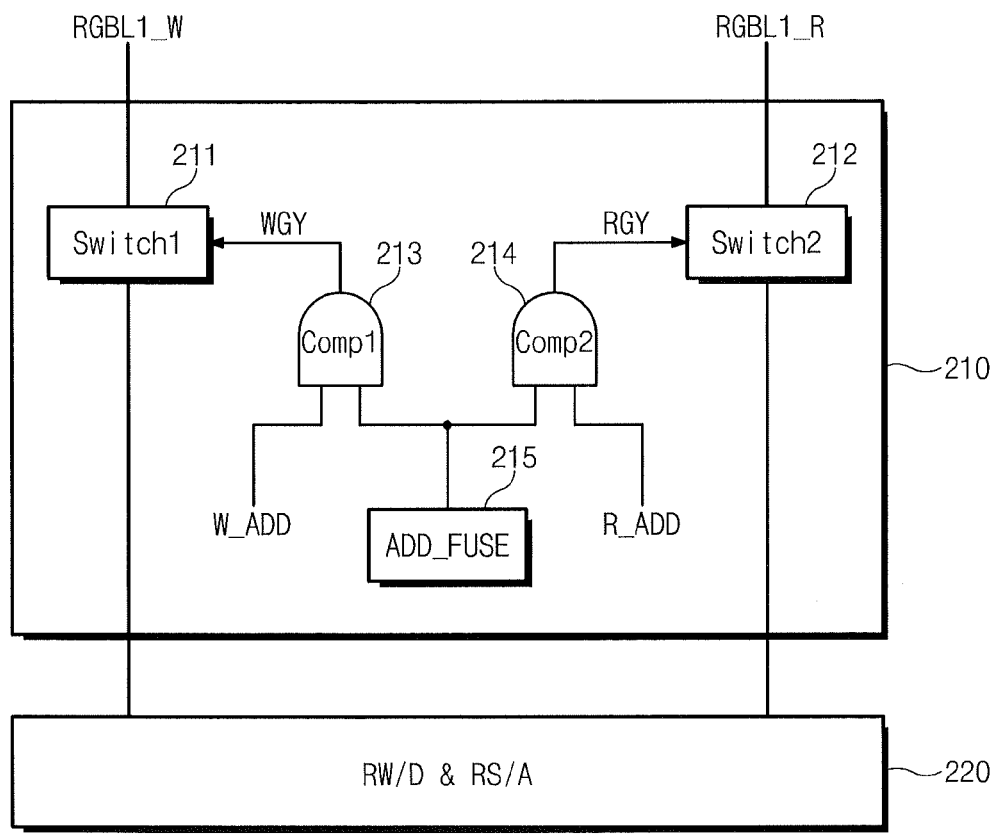
FIG. 17 is a diagram illustrating an RGBL selector of FIG. 16.

FIG. 17 is a diagram illustrating a system 200 including the redundancy global bit line selector of FIG. 16. Referring to FIG. 17, the redundancy global bit line selector RGBL selector 210 may include a first switch 211 and a second switch 212, a first comparator 213 and a second comparator 214, and an address fuse 215.

The address fuse 215 may store an address of a global bit line to be replaced. For example, if the first redundancy global write bit line RGBL1_W may replace the first global write bit line GBL1_W, and the first redundancy global read bit line RGBL1_R may replace the first global read bit line GBL1_R, the address fuse 215 may store addresses corresponding to the first global write bit line GBL1_W and the first global read bit line GBL1_R.

The first comparator 213 may compare a write address W_ADD input from the outside with the address stored in the address fuse 215. If the write address W_ADD input from the outside is identical to the address stored in the address fuse 215, the first comparator 213 may activate a write signal WGY. The first switch 211 may electrically connect the first redundancy global write bit line RGBL1_W to a redundancy write driver and redundancy sense amplifier RW/D & RS/A 220 in response to the activated write signal WGY.

In example embodiments, the address fuse 215 may store the addresses corresponding to the first redundancy global write bit line RGBL1_W and the first global read bit line GBL1_R. Accordingly, the first redundancy global write bit line RGBL1_W may replace the first global write bit line GBL1_W.

The second comparator 214 may compare a read address R_ADD input from the outside with the address stored in the address fuse 215. If the read address R_ADD input from the outside is identical to the address stored in the address fuse 215, the first comparator 213 may activate a read signal RGY. The second switch 212 may connect the first redundancy global read bit line RGBL1_R to a redundancy write driver and redundancy sense amplifier RW/D & RS/A 220 in response to the activated write signal RGY.

In example embodiments, the address fuse 215 may store the address corresponding to the first global write bit line GBL1_W and the first global read bit line GBL1_R. Accordingly, the read signal RGY may be inactivated. The second switch 212 may not electrically connect the first redundancy global read bit line RGBL1_R to the redundancy write driver and redundancy sense amplifier RW/D & RS/A 220 in response to the inactivated read signal. The first redundancy global read bit line RGBL1_R may not replace a second global read bit line GBL2_R.

As described above, the integration degree of the nonvolatile memory device according to example embodiments may be improved by allowing a plurality of memory banks to share global write bit lines and global read bit lines. In addition, the access performance of the nonvolatile memory device may be increased by performing a read operation on a different memory bank during a write operation for one memory bank. Furthermore, the reliability of the nonvolatile memory device may be improved by replacing a main area having a defect with a redundancy area.

Figure 18:
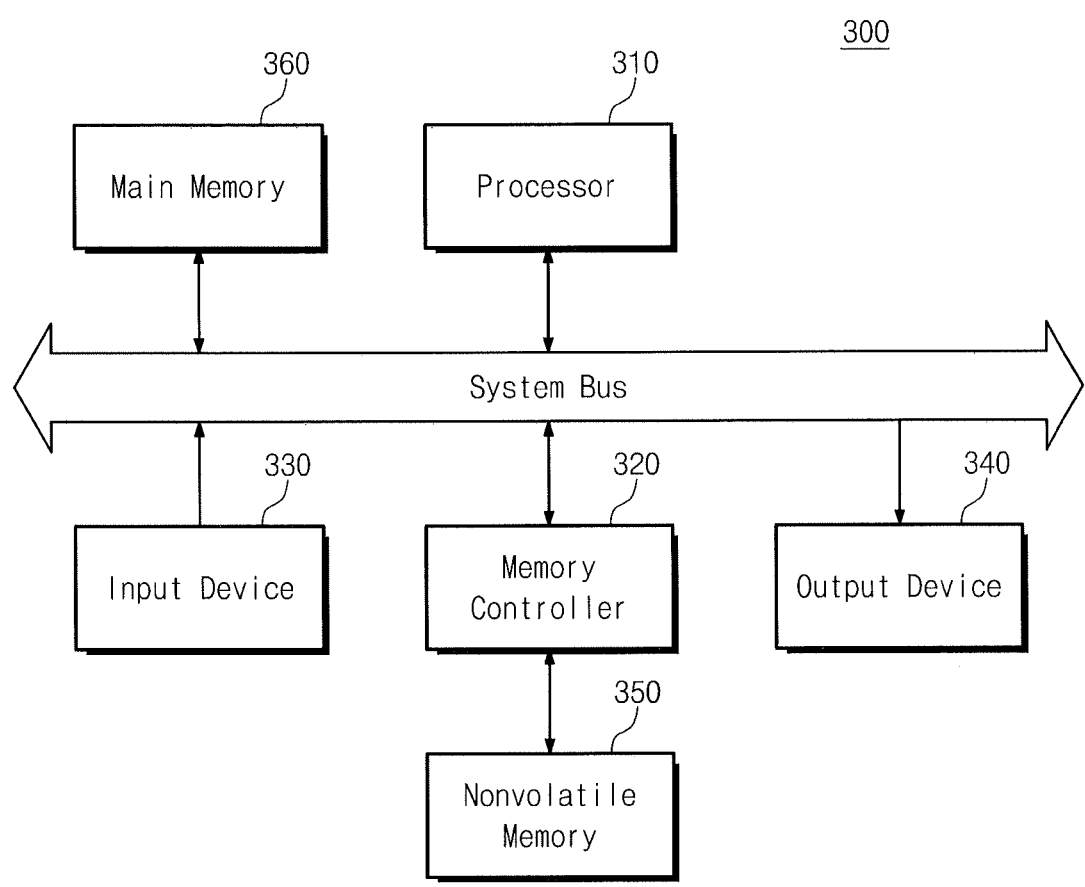
FIG. 18 is a block diagram illustrating a computing system including a semiconductor memory system according to an example embodiment.

FIG. 18 is a block diagram illustrating a computing system including a semiconductor memory system according to an example embodiment. Referring to FIG. 18, a computing system 300 may include a processor 310, a controller 320, input devices 330, output devices 340, a nonvolatile memory 350, and a main memory 360. The solid line in FIG. 18 represents a system bus through which data or commands are transferred.

The computer system 300 may receive data from the outside through input devices (e.g., keyboards and cameras) 330. The input data may be stored in the nonvolatile memory 350 or the main memory 360.

The controller 320 may control the components in response to the command from the outside.

The processor may perform a process in response to the control of the controller 320. The processing result may be stored in the nonvolatile memory 350 or the main memory 360.

The output devices 340 may output data stored in the nonvolatile memory 350 or the RAM 360 in response to the control of the controller 320. The output devices 340 may output data stored in the nonvolatile memory 350 in a form that can be sensed by a user. For example, the output device 340 may include a display and a speaker. A repair method according to an example embodiments of the inventive concepts may be applied to, for example, the nonvolatile memory 350.

The nonvolatile memory 350 and/or the controller 320 may be mounted in various forms of packages. For example, the nonvolatile memory 350 and/or the controller 320 may be mounted in packages such as Package on Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), Thin Quad Flat Pack (TQFP), System In Package (SIP), Multi Chip Package (MCP), Wafer-level Fabricated Package (WFP), and Wafer-level Processed Stack Package (WSP).

Although not shown, the computing system 300, may require a power supply to supply power necessary for the operation of the computing system 300. If the computing system 300 is a mobile device, a battery may be provided to supply operation power. As the performance and life of the nonvolatile memory increases, the performance and life of the computing system 300 may also increase.

Figure 19:
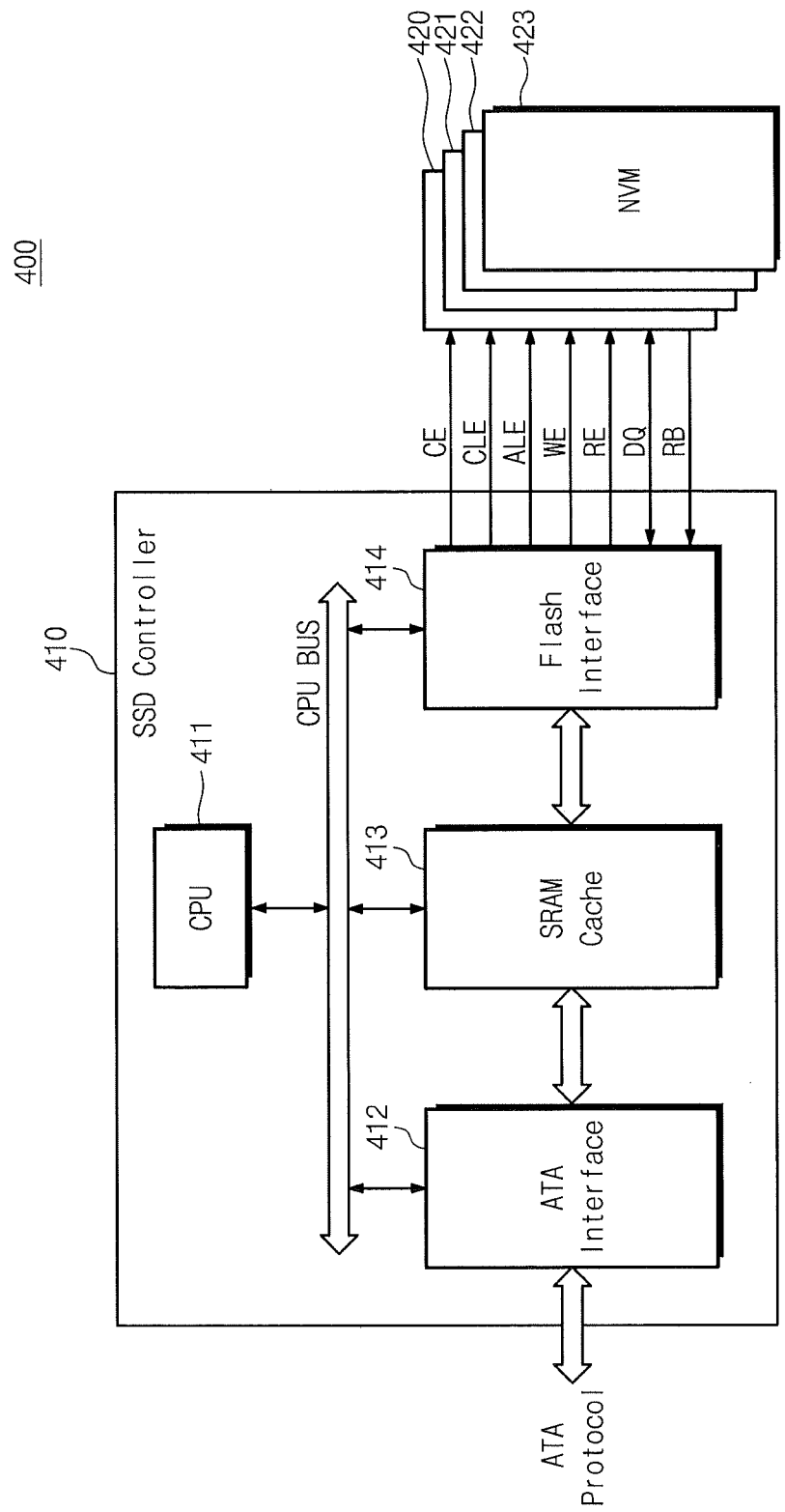
FIG. 19 is a block diagram illustrating a Solid State Drive (SSD) system including a nonvolatile memory device according to an example embodiment.

FIG. 19 is a block diagram illustrating a Solid State Drive (SSD) system 400 including a nonvolatile memory device according to an embodiment. Referring to FIG. 19, an SSD system 400 may include an SSD controller 410 and flash memories 420 to 423.

The computing system according to example embodiments may be applied to an SSD. Recently, SSD products expected to replace Hard Disk Drives (HDDs) are getting the spotlight in the next-generation memory market. The SSD is a data storage device using memory chips such as flash memories instead of a rotating disk used in a typical HDD to store data. The SSDs have the advantages of high-speed, high shock-resistance, and low power consumption compared to HDDs that are mechanically operated.

Referring again to FIG. 19, a Central Processing Unit (CPU) 411 may receive commands from a host, and then determines whether to store data from the host in a flash memory or to transmit data read out from the flash memory to the host. An Advanced Technology Attachment (ATA) interface 412 may exchange data with the host under the control of the CPU 411. The ATA interface 412 may patch commands and addresses from the host to deliver to CPU 411 through a CPU bus. Data received from a host through the ATA interface 412 or transmitted to the host may be delivered through a SRAM cache 413 without passing the CPU bus under the control of the CPU 411.

The SRAM cache 413 may temporarily store data to be transferred between the host and the flash memories 420 to 423. The SRAM cache 413 may also store programs to be executed by the CPU 411. The SRAM cache 413 may be considered as a kind of buffer memory, and may not necessarily include an SRAM. A flash interface 414 may exchange data with nonvolatile memories used as a storage device. The flash interface 414 may be configured to support NAND flash memories, One-NAND flash memories, and multi-level flash memories.

A semiconductor computing system according to example embodiments may be used as a portable storage device. Accordingly, the semiconductor computing system may be used as a storage device in MP3s, digital cameras, PDAs, e-books, digital TVs, and computers.

A semiconductor memory device according to example embodiments may include a plurality of memory banks. The plurality of memory banks may share a write circuit and a detect circuit. According to example embodiments, the integration degree and the processing speed of a semiconductor memory device may be improved. Also, a semiconductor memory device according to example embodiments may have an error repair function, thereby having improved reliability.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A semiconductor memory device comprising:
a main area including a plurality of first memory blocks sharing a first write bit line and sharing a first read bit line, the first write bit line being separate from the first read bit line; and
a redundancy area configured to replace one or more defective components of the first memory blocks, the redundancy area including a plurality of second memory blocks sharing a second write bit line and sharing a second read bit line, the second write bit line being separate from the second read bit line, wherein
the first memory blocks include first local bit line selectors, the first local bit line selectors configured to selectively connect a first local bit line in a corresponding one of the plurality of first memory blocks to both of the corresponding first write bit line and the corresponding first read bit line, and
wherein each of the first local bit line selectors is coupled to an end of the corresponding first local bit line,
wherein the first memory blocks are arranged in a direction along at least one of the first read bit line and the first write bit line,
wherein each of the first local bit line selectors includes a first gate configured to selectively connect the first local bit line to the first write bit line and a second gate configured to selectively connect the first local bit line to the first read bit line, the first and second gates each being connected to the first local bit line through a common first node such that no intervening connection to memory cells of the memory device exist between the first gate and the first node or the second gate and the first node.

2. The semiconductor memory device of claim 1, wherein the second memory blocks include second local bit line selectors, the second local bit line selectors configured to selectively connect a second local bit line in a corresponding second memory block to one of the second write bit line and the second read bit line.

3. The semiconductor memory device of claim 2, wherein the first local bit line selector connects the first local bit line to the first write bit line to perform a write operation on the corresponding first memory block, and
the second local bit line selector connects the second local bit line to the second write bit line to perform a write operation on the corresponding second memory block.

4. The semiconductor memory device of claim 2, wherein the first local bit line selector connects the first local bit line to the first read bit line to perform a read operation on the corresponding first memory block, and
the second local bit line selector connects the second local bit line to the second read bit line to perform a read operation on the corresponding second memory block.

5. The semiconductor memory device of claim 1, wherein the semiconductor memory device is configured to perform a read operation on a different memory block during a write operation on one of the plurality of first memory blocks.

6. The semiconductor memory device of claim 5, wherein the semiconductor memory device is configured to perform a read operation on another memory block when the read operation is completed on the different memory block during the write operation on the one of the plurality of first memory blocks.

7. The semiconductor memory device of claim 1, wherein during a write operation on one of the plurality of first memory blocks, the semiconductor memory device is configured to perform a read operation on a different memory block that shares the first write bit line and the first read bit line with the one of the plurality of first memory blocks.

8. The semiconductor memory device of claim 1, wherein during a write operation on one of the plurality of first memory blocks, the semiconductor memory device is configured to perform a read operation on a different memory block that does not share the first write bit line and the first read bit line with the one of the plurality of first memory blocks.

9. The semiconductor memory device of claim 1, wherein the second memory blocks include a second local bit line selector configured to selectively connect a second local bit line in a corresponding second memory block to the second write bit line or the second read bit line.

10. The semiconductor memory device of claim 9, wherein the second local bit line selector connects the second local bit line to the second write bit line to perform a write operation on the corresponding second memory block.

11. The semiconductor memory device of claim 9, wherein the second local bit line selector connects the second local bit line to the second read bit line to perform a read operation on the corresponding second memory block.

12. The semiconductor memory device of claim 9, wherein the semiconductor memory device is configured to perform a read operation on one of the plurality of second memory blocks during a write operation on one of the plurality of first memory blocks.

13. The semiconductor memory device of claim 12, wherein the semiconductor memory device is configured to perform a read operation on another memory block when the read operation is completed on the one of the plurality of the second memory blocks during the write operation on the one of the plurality of first memory blocks.

14. The semiconductor memory device of claim 12, wherein the semiconductor memory device is configured to perform a read operation on another memory block of the second memory blocks when the read operation is completed on the one of the plurality of the second memory blocks during the write operation on the one of the plurality of first memory blocks.

15. The semiconductor memory device of claim 9, wherein during a write operation on one of the plurality of first memory blocks, the semiconductor memory device is configured to perform a read operation on a different memory block of the second memory blocks that shares the second write bit line and the second read bit line with the one of the plurality of second memory blocks.

16. The semiconductor memory device of claim 15, wherein the semiconductor memory device is configured to perform a read operation on another memory block of the first memory blocks when the read operation is completed on the different memory.

17. The semiconductor memory device of claim 15, wherein the semiconductor memory device is configured to perform a read operation on another memory block of the second memory blocks when the read operation is completed on the one of the plurality of the second memory blocks during the write operation on the one of the plurality of first memory blocks.

18. The semiconductor memory device of claim 1, wherein the redundancy area includes an address fuse, and is configured to activate the second write bit line corresponding to the address fuse if an address stored in the address fuse is identical to an input write address.

19. The semiconductor memory device of claim 1, wherein the redundancy area includes an address fuse, and is configured to activate the second read bit line corresponding to the address fuse if an address stored in the address fuse is identical to an input write address.

20. The semiconductor memory device of claim 1, wherein the second memory blocks are arranged in a direction along at least one of the second read bit line and the second write bit line.

* * * * *